(12) United States Patent
Saotome

(10) Patent No.: US 12,015,288 B2
(45) Date of Patent: Jun. 18, 2024

(54) ELECTRICAL ENERGY STORAGE DEVICE

(71) Applicant: HONDA MOTOR CO., LTD., Tokyo (JP)

(72) Inventor: Koji Saotome, Tokyo (JP)

(73) Assignee: Honda Motor Co., Ltd., Tokyo (JP)

( * ) Notice: Subject to any disclaimer, the term of this patent is extended or adjusted under 35 U.S.C. 154(b) by 412 days.

(21) Appl. No.: 17/395,859

(22) Filed: Aug. 6, 2021

(65) Prior Publication Data

US 2022/0045523 A1 Feb. 10, 2022

(30) Foreign Application Priority Data

Aug. 7, 2020 (JP) .................. 2020-134776

(51) Int. Cl.
*H02J 7/00* (2006.01)
*B60L 58/22* (2019.01)
(Continued)

(52) U.S. Cl.
CPC ............ *H02J 7/0016* (2013.01); *B60L 58/22* (2019.02); *G01R 31/382* (2019.01);
(Continued)

(58) Field of Classification Search
CPC .......... B60L 58/22; B60L 53/00; B60L 58/10; B60L 58/18; G01R 31/382; H01F 27/2804; H01F 38/14; H01F 2027/2809; H01M 10/441; H01M 10/482; H02J 7/0016; H02J 7/0019
See application file for complete search history.

(56) References Cited

U.S. PATENT DOCUMENTS 8,896,315 B1 * 11/2014 Davies .................. H02J 7/0016
320/120
11,432,437 B2 * 8/2022 Takahara ................ H01F 27/24
2009/0322155 A1 12/2009 Oh et al.

FOREIGN PATENT DOCUMENTS

JP 2005-005181 A 1/2005
JP 2005005181 A * 1/2005
(Continued)

OTHER PUBLICATIONS

Office Action dated Oct. 10, 2023 issued over the corresponding Japanese Patent Application 2020-134776 with the English machine translation thereof.

*Primary Examiner* — Richard Isla
*Assistant Examiner* — Sadia Kousar
(74) *Attorney, Agent, or Firm* — Carrier, Shende & Associates P.C.; Joseph P. Carrier; Jeffrey T. Gedeon

(57) ABSTRACT

An electrical energy storage device is constituted by connecting together a plurality of battery cells. Each of the battery cells includes a transformer forming unit constituted by a first inductor, a second inductor, a first core member, and a second core member, and which is capable of forming a transformer between itself and an adjacent battery cell, and a potential detection unit that detects the potential of the battery cell. A control unit compares the potentials of the adjacent battery cells based on measurement results of a potential detection unit. Furthermore, the control unit performs an equalization control to equalize the potentials of the plurality of battery cells, by supplying electrical charge from the battery cell having a higher potential to the battery cell having a lower potential.

8 Claims, 16 Drawing Sheets

(51) Int. Cl.
*G01R 31/382* (2019.01)
*H01M 10/48* (2006.01)

(52) U.S. Cl.
CPC ......... *H01M 10/482* (2013.01); *H02J 7/0018* (2013.01); *H02J 7/0019* (2013.01)

(56) References Cited

FOREIGN PATENT DOCUMENTS

| | | | |
|---|---|---|---|
| JP | 2005-033855 A | | 2/2005 |
| JP | 2009-219181 A | | 9/2009 |
| JP | 2009-540793 A | | 11/2009 |
| JP | 2009284606 A | * | 12/2009 |
| JP | 2013-051856 A | | 3/2013 |
| JP | 2013-247690 A | | 12/2013 |
| JP | 2018-142544 A | | 9/2018 |

* cited by examiner

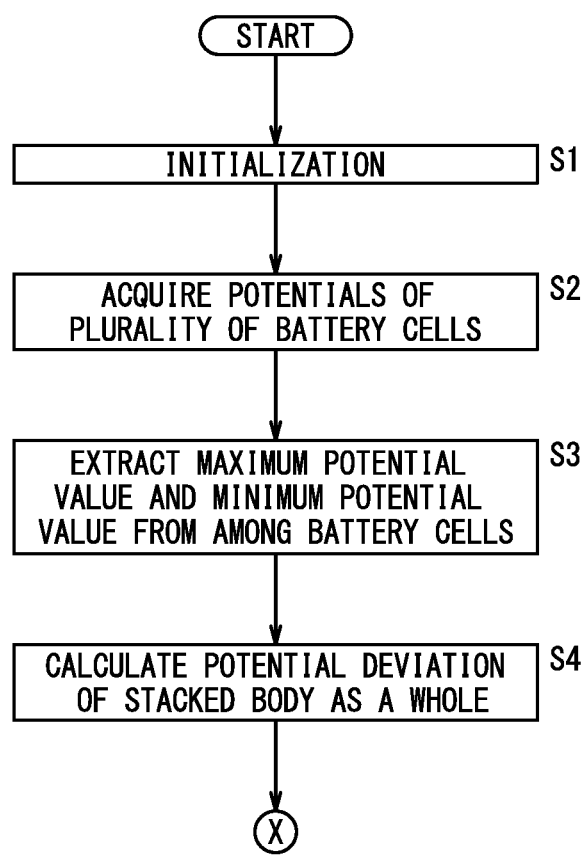

ELECTRICAL ENERGY STORAGE DEVICE

CROSS-REFERENCE TO RELATED APPLICATION

This application is based upon and claims the benefit of priority from Japanese Patent Application No. 2020-134776 filed on Aug. 7, 2020, the contents of which are incorporated herein by reference.

BACKGROUND OF THE INVENTION

Field of the Invention

The present invention relates to an electrical energy storage device configured by connecting together a plurality of battery cells.

Description of the Related Art

In JP 2009-540793 A, a charge equalization apparatus (electrical energy storage device) having a plurality of battery cells is disclosed. Each of the plurality of battery cells includes a transformer made up from a primary side inductor and a secondary side inductor.

More specifically, the primary side inductor is connected in series with the battery cell and a switching circuit (a FET or the like), while on the other hand, the secondary side inductor is connected in parallel with a secondary side inductor of another battery cell. In the electrical energy storage device, a current is made to flow through the primary side inductor of a battery cell having a high potential to thereby induce a current in the secondary side inductor, and the induced current is made to flow through the secondary side inductor of another battery cell having a low potential to thereby induce a current in the primary side inductor. Consequently, electrical charges move between predetermined ones of the battery cells, and the potentials amongst the battery cells become relatively close to each other.

SUMMARY OF THE INVENTION

However, with the configuration as disclosed in JP 2009-540793 A, in which each of the plurality of battery cells includes transformers (a primary side transformer and a secondary side transformer) and a switching circuit (FET), a variation in the windings of the transformers and a variation in the diode characteristics or the like of each of the battery cells becomes large. Therefore, a problem arises in which, even if the electrical charge is transferred from one battery cell to another battery cell, it is difficult to accurately equalize the electrical charges of the plurality of battery cells as a whole.

Further, if each of the battery cells is provided with a transformer including a primary side inductor and a secondary side inductor, the electrical energy storage device becomes large in scale. Therefore, an inconvenience occurs in that the layout of the electrical energy storage device is deteriorated.

The present invention has been devised in order to solve the aforementioned problems, and an object of the present invention is to provide an electrical energy storage device which, with a simple configuration, is capable of evenly distributing potentials amongst a plurality of battery cells, and which is excellent in terms of layout.

In order to achieve the aforementioned objects, an aspect of the present invention is characterized by an electrical energy storage device including a plurality of battery cells connected together, each of the plurality of battery cells including a transformer forming unit including an inductor and a core member, and configured to form a transformer between the transformer forming unit itself and an inductor and a core member of an adjacent battery cell, and a potential detection unit configured to detect a potential of the battery cell, the electrical energy storage device further including a control unit configured to control an energized state of the inductor in each of the plurality of battery cells, wherein the control unit compares the potentials of the adjacent battery cells based on measurement results of the potential detection unit, and via the transformer in which the inductor of a battery cell having a higher potential is made to serve as a primary side inductor and the inductor of another battery cell having a lower potential is made to serve as a secondary side inductor, performs an equalization control to equalize the potentials of the plurality of battery cells, by supplying electrical charge from the battery cell having the higher potential to the battery cell having the lower potential.

The above-described electrical energy storage device, with a simple configuration, is capable of evenly distributing potentials amongst the plurality of battery cells, and is excellent in terms of layout.

The above and other objects, features, and advantages of the present invention will become more apparent from the following description when taken in conjunction with the accompanying drawings, in which preferred embodiments of the present invention are shown by way of illustrative example.

BRIEF DESCRIPTION OF THE DRAWINGS

FIG. 8 is a flowchart showing one portion of a process flow of an equalization control;

DETAILED DESCRIPTION OF THE PREFERRED EMBODIMENTS

A preferred embodiment of the present invention will be presented and described in detail below with reference to the accompanying drawings.

First Embodiment

Figure 1:
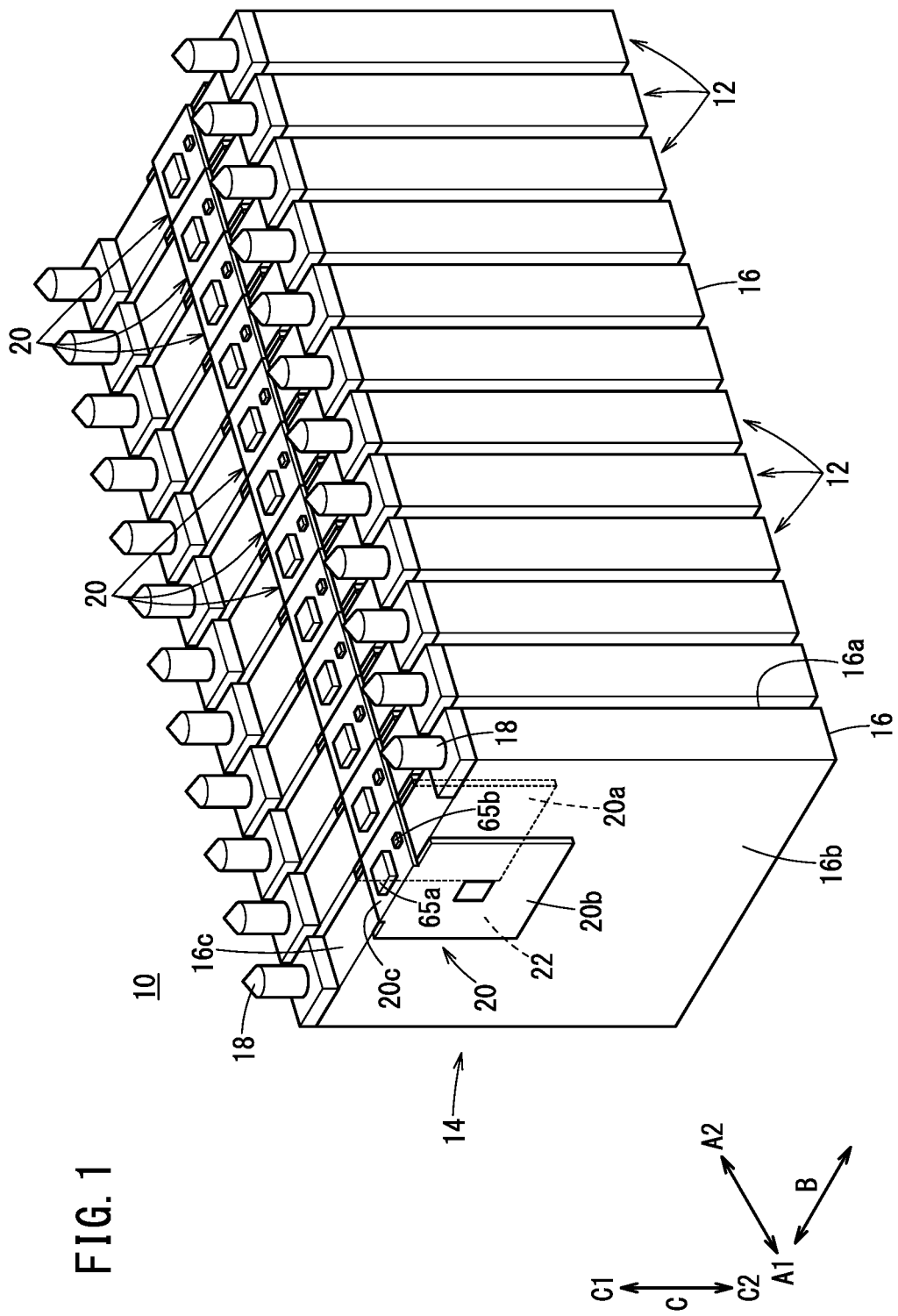
FIG. 1 is a perspective view showing the structure of an electrical energy storage device according to a first embodiment of the present invention.

As shown in FIG. 1, an electrical energy storage device 10 according to a first embodiment of the present invention is equipped with a plurality of battery cells 12 which are unit batteries. The plurality of battery cells 12 are connected mutually in series, and are stacked in the direction of the arrow A to thereby form a stacked body 14. The stacked body 14 is installed on a mounting target in a state of being accommodated in a non-illustrated casing, or alternatively, in a state of being fastened together and fixed by a non-illustrated frame member. The electrical energy storage device 10 is applied in the form of a vehicle mounted battery, for example, of an electric vehicle, a hybrid vehicle, a fuel cell vehicle, or the like. The electrical energy storage device 10 may also be applied to a stationary power source, a power source of a mobile terminal, or the like.

Each of the battery cells 12 is not particularly limited, but there may be applied thereto, for example, a rechargeable secondary battery, such as a lithium ion battery, a nickel hydrogen battery, a NiCad battery, a lead-acid battery, a high metal ion battery, an all-solid-state battery, or the like. Each of the battery cells 12 includes a main body 16 constituting a battery pack, a pair of electrode terminals 18 (a positive terminal and a negative terminal) which serve as power input/output terminals of the main body 16, and a charge (energy) transfer structure 20 for monitoring the power of each of the battery cells 12, and performing transfer of electrical charge (electrical energy) between the battery cells 12.

The main body 16 is wide in the direction of the arrow B and the direction of the arrow C, and exhibits a thin rectangular parallelepiped shape in the stacking direction (in the direction of the arrow A). Both side surfaces of the main body 16 in the stacking direction are formed to be substantially flat (hereinafter, the surface on the side of the arrow A2 in FIG. 1 will be referred to as a first surface 16a, and the surface on the side of the arrow A1 will be referred to as a second surface 16b).

The pair of electrode terminals 18 are connected to non-illustrated electrodes (a positive electrode and a negative electrode) in the main body 16, and are disposed at both ends in the longitudinal direction (the direction of the arrow B) on an upper surface 16c (an end face on the side of the arrow C1) of the main body 16.

The charge transfer structure 20 is formed in a plate shape (sheet shape) which is significantly thinner than the thickness of the main body 16, and includes a circuit 22 for performing an equalization control to equalize the potentials of the battery cells 12. The charge transfer structure 20 exhibits a U-shape when viewed from the side, and is constituted as a support member which is installed in a manner of being hooked onto an upper surface 16c of the main body 16, together with being suspended from the upper surface 16c along the first surface 16a and the second surface 16b of the main body 16. Hereinafter, in the charge transfer structure 20, a portion thereof arranged on the first surface 16a will be referred to as a first site 20a, a portion thereof arranged on the second surface 16b will be referred to as a second site 20b, and a portion thereof arranged on the upper surface 16c will be referred to as a third site 20c.

Figure 2:
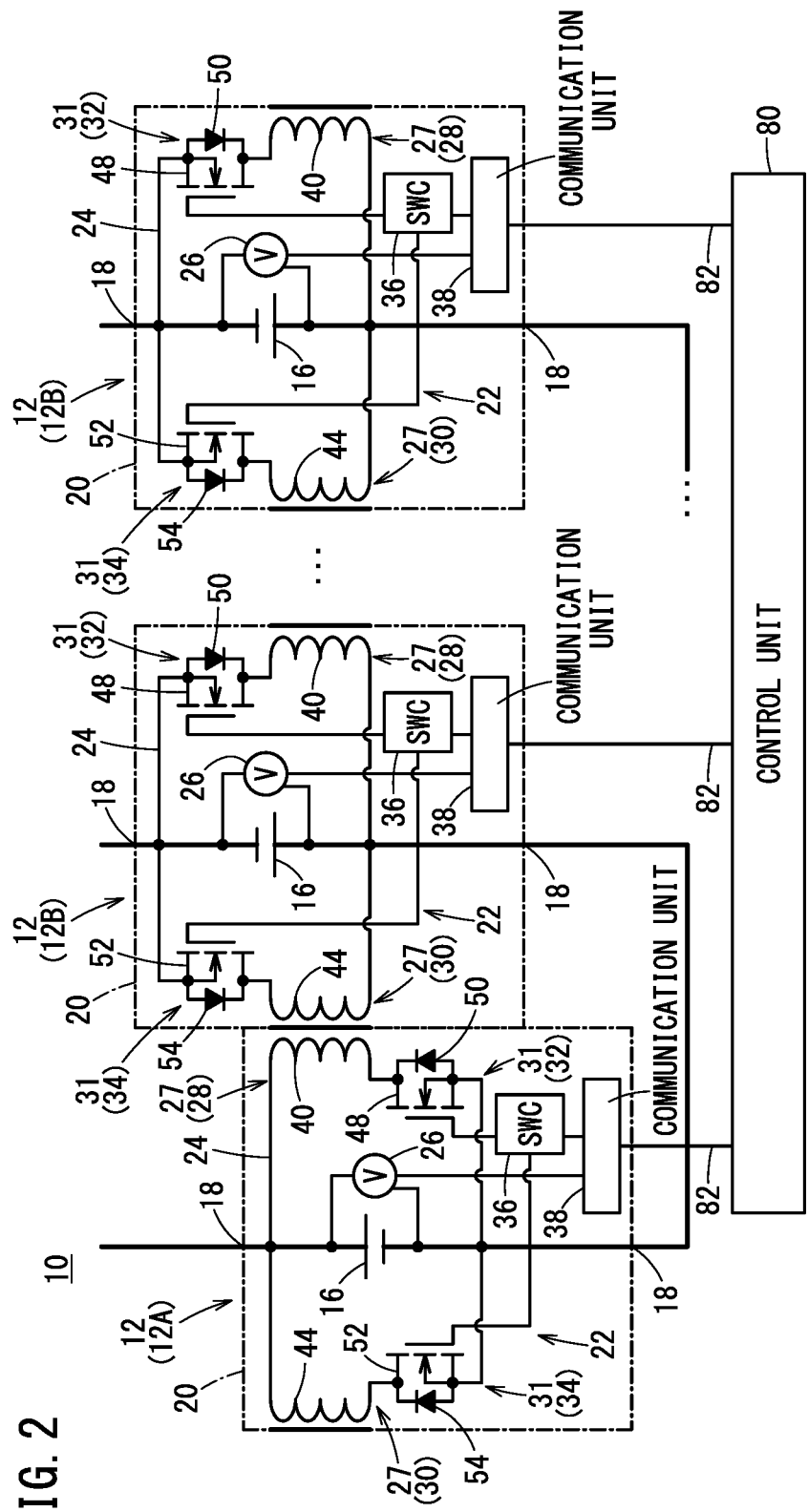
FIG. 2 is a circuit diagram showing a circuit between a plurality of battery cells.

As shown in FIG. 2, the circuit 22 includes a plurality of wirings 24, together with having a potential detection unit 26, transformer forming units 27 (a first transformer forming unit 28 and a second transformer forming unit 30), switching circuits 31 (a first switching circuit 32 and a second switching circuit 34), a SW controller 36 (switch controller: abbreviated by SWC in FIG. 2), and a communication unit 38, which are connected to the respective wirings 24.

The potential detection unit 26 is connected to electrodes (a positive electrode and a negative electrode) inside the main body 16 via a pair of the wirings 24, and detects the potential (cell voltage) of the battery cell 12. It should be noted that the potential detection unit 26 may be connected to the pair of electrode terminals 18. The potential detection unit 26 is connected to the communication unit 38 via ones of the wirings 24 used for communication, and transmits the detected potential information to the communication unit 38.

The first transformer forming unit 28 is disposed in the first site 20a of the charge transfer structure 20, and is arranged on the first surface 16a of the main body 16. The first transformer forming unit 28 forms a transformer (transforming means) between the first transformer forming unit 28 and the second transformer forming unit 30 of an adjacent battery cell 12. Moreover, the battery cell 12, which is arranged at an end on the side of the arrow A1 in the stacked body 14, may have a configuration that is not equipped with the first transformer forming unit 28 and the first switching circuit 32 (in other words, the first site 20a of the charge transfer structure 20).

Figure 3:
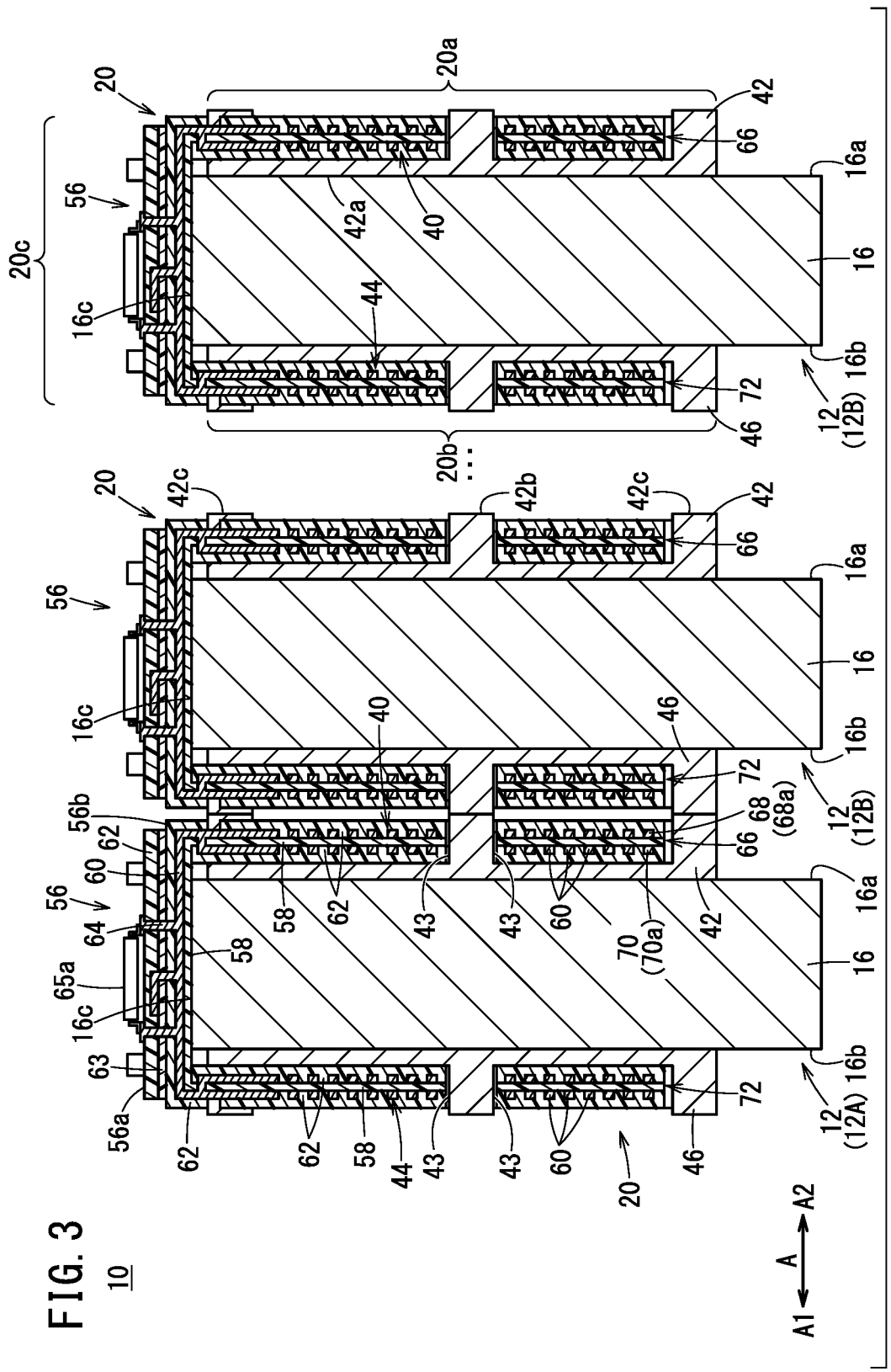
FIG. 3 is a side cross-sectional view schematically showing charge transfer structures of a plurality of battery cells.
Figure 4A:
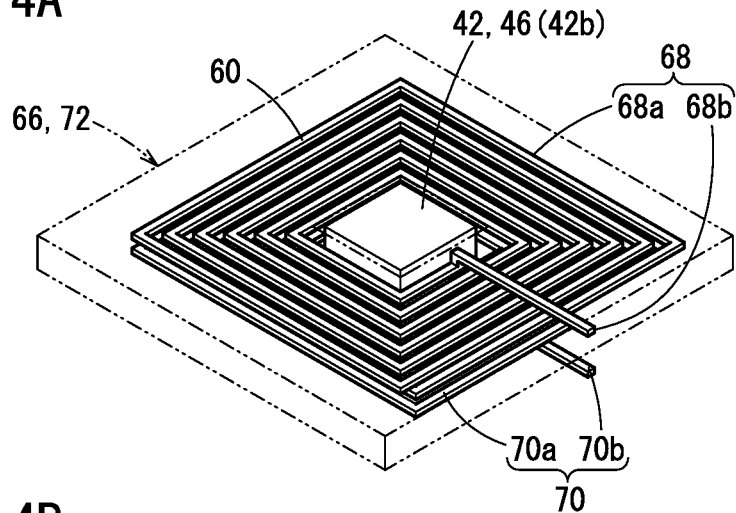
FIG. 4A is a perspective view showing the structure of a stacked body of a transformer forming unit.
Figure 4B:
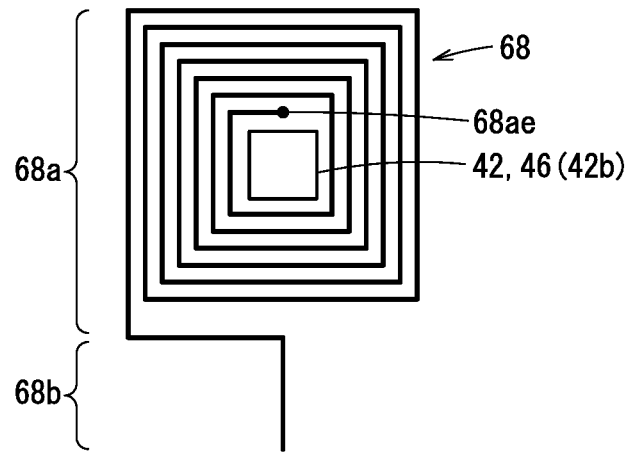
FIG. 4B is a schematic plan view of a first copper wire as viewed from one side in a stacking direction.
Figure 4C:
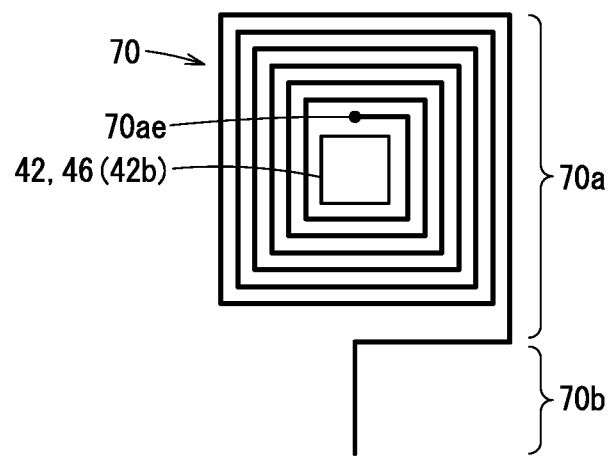
FIG. 4C is a schematic plan view of a second copper wire as viewed from one side in the stacking direction.

The first transformer forming unit 28 is constituted to include a first inductor 40 and a first core member 42 (see FIG. 3). One end of the first inductor 40 is connected via one of the wirings 24 to an electrode (a positive electrode) inside the main body 16. Another end of the first inductor 40 is connected via one of the wirings 24 to the first switching circuit 32. The first core member 42 causes a magnetic flux to be generated in a predetermined direction in accordance with the direction in which the current of the first inductor 40 flows.

The second transformer forming unit 30 is disposed in the second site 20*b* of the charge transfer structure 20, and is arranged on the second surface 16*b* of the main body 16. The second transformer forming unit 30 forms a transformer between the second transformer forming unit 30 and the first transformer forming unit 28 of an adjacent battery cell 12, as described above. Moreover, the battery cell 12, which is arranged at an end on the side of the arrow A2 in the stacked body 14, may have a configuration that is not equipped with the second transformer forming unit 30 and the second switching circuit 34 (the second site 20*b* of the charge transfer structure 20).

The second transformer forming unit 30 is constituted to include a second inductor 44 and a second core member 46 (see FIG. 3). One end of the second inductor 44 is connected via one of the wirings 24 to an electrode (a positive electrode) inside the main body 16. Another end of the second inductor 44 is connected via one of the wirings 24 to the second switching circuit 34. The second core member 46 causes a magnetic flux to be generated in a predetermined direction in accordance with the direction in which the current of the second inductor 44 flows. The specific structure of the aforementioned transformer forming units 27 will be described in detail later.

The first switching circuit 32 switches between energization and interruption of current flowing from the electrode (positive electrode) inside the main body 16 toward the electrode (negative electrode) inside the main body 16 via the first inductor 40. Further, the first switching circuit 32 allows energization of the current flowing from the electrode (negative electrode) inside the main body 16 toward the electrode (positive electrode) inside the main body 16 via the first inductor 40. The first switching circuit 32 includes a field effect transistor (first FET 48) and a first diode 50.

The first FET 48 is an element that actually performs switching in the first switching circuit 32. The source of the first FET 48 is connected to an electrode (negative electrode) inside the main body 16. The drain of the first FET 48 is connected to the other end of the first inductor 40. The gate of the first FET 48 is connected to the SW controller 36. More specifically, based on the application of a voltage from the SW controller 36 to the gate, the first FET 48 switches between passage and interruption of current flowing between the source and the drain in the first FET 48.

The first diode 50 is connected in parallel to the first FET 48, and allows current to pass from the anode to the cathode, while restricting passage of current from the cathode to the anode. More specifically, the anode is connected to one of the wirings 24 between the source of the first FET 48 and the electrode (negative electrode), while on the other hand, the cathode is connected to one of the wirings 24 between the drain of the first FET 48 and the first inductor 40.

The second switching circuit 34, similar to the first switching circuit 32, switches between energization and interruption of current flowing from the electrode (positive electrode) inside the main body 16 to the electrode (negative electrode) inside the main body 16 via the second inductor 44. Further, the second switching circuit 34 allows energization of the current flowing from the electrode (negative electrode) inside the main body 16 toward the electrode (positive electrode) inside the main body 16 via the second inductor 44. The second switching circuit 34 includes a field effect transistor (second FET 52) and a second diode 54.

The source of the second FET 52 is connected to an electrode (negative electrode) inside the main body 16. The drain of the second FET 52 is connected to the other end of the second inductor 44. The gate of the second FET 52 is connected to the SW controller 36. More specifically, based on the application of a voltage from the SW controller 36 to the gate, the second FET 52 switches between passage and interruption of current flowing between the source and the drain in the second FET 52.

The second diode 54 is connected in parallel to the second FET 52, and allows current to pass from the anode to the cathode, while restricting passage of current from the cathode to the anode. More specifically, the anode is connected to one of the wirings 24 between the source of the second FET 52 and the electrode (negative electrode), while on the other hand, the cathode is connected to one of the wirings 24 between the drain of the second FET 52 and the second inductor 44.

The SW controller 36 is connected, via the respective wirings 24, to the gate of the first FET 48, and the gate of the second FET 52. The SW controller 36 assumes an off state in which voltages are not applied to each of the gates at a normal time, and wherein voltages are applied to each of the gates under the command of a later-described control unit 80 of the electrical energy storage device 10. More specifically, under the command of the control unit 80, the SW controller 36 individually energizes (supplies current) between the source and drain of the first FET 48, and between the source and drain of the second FET 52.

The communication unit 38 is connected to the potential detection unit 26 and the SW controller 36 via the ones of the wirings 24 used for communication, together with being connected via a communication line 82 to the control unit 80 of the electrical energy storage device 10, and carrying out communication of information between them and the control unit 80. The communication unit 38 transmits the potential information detected by the potential detection unit 26 to the control unit 80, and further, upon receiving a command for the SW controller 36 from the control unit 80, outputs such a command to the SW controller 36.

Next, with reference to FIG. 3, a description will be given concerning a mode in which the above-described circuit 22 is provided in the charge transfer structure 20 which serves as a support member. As described above, the charge transfer structure 20 is equipped with the first transformer forming unit 28 at the first site 20*a* arranged on the first surface 16*a* of the main body 16, and is equipped with the second transformer forming unit 30 arranged at the second site 20*b* of the main body 16. Further, in the charge transfer structure 20, the potential detection unit 26, the first switching circuit 32, the second switching circuit 34, the SW controller 36, and the communication unit 38 are arranged at the third site 20*c* which is disposed on the upper surface 16*c* of the main body 16 (refer also to FIG. 2).

Concerning the third site 20*c* of the charge transfer structure 20, for example, it is preferable to apply thereto a rigid flexible circuit board (hereinafter, simply referred to as a circuit board 56) on which electrical components are capable of being mounted. A rigid portion 56*a* of the circuit board 56 is made up from a stacked structure in which a base film 58, copper foils 60, a cover layer 62, a rigid layer 63, and so forth are stacked and joined by an adhesive layer (not shown).

The base film 58 is made up from an insulating material possessing flexibility such as a polyimide resin or the like.

The copper foils 60 are conductive paths for electrical charge, and primarily form the wirings 24 of the above-described circuit 22. Similar to the base film 58, the cover layer 62 is made up from an insulating material such as a polyimide resin or the like. Further, the rigid layer 63 is made up from an insulating material that is a harder material than the base film 58.

On the other hand, flexible portions 56b of the circuit board 56 are made up from a stacked structure in which the base film 58, the copper foils 60, the cover layer 62, and so forth are stacked and joined by an adhesive layer (not shown). In the flexible portions 56b, a large number of pores are formed therein by applying an appropriate surface treatment to the cover layer 62, whereby flexibility is increased.

The circuit board 56 which is configured in this manner simplifies the mounting of electrical components, together with facilitating a three-dimensional arrangement by bending the flexible portions 56b. More specifically, the circuit board 56, in addition to the upper surface 16c of the main body 16, extends to an upper end of the first surface 16a and an upper end of the second surface 16b, and the rigid portion 56a is positioned on the upper surface 16c, whereas the flexible portions 56b are positioned at the corners of the main body 16 and are configured so as to bend.

The copper foils 60 of the rigid portion 56a of the circuit board 56 are disposed on the base film 58 and on another layer (for example, on the rigid layer 63) via through holes 64 that are provided at appropriate positions in each of the layers. The potential detection unit 26, the first FET 48, the first diode 50, the second FET 52, the second diode 54, the SW controller 36, and the communication unit 38 are mounted on an upper surface of the rigid portion 56a. Although in FIGS. 1 and 3, a state is shown in which a single IC chip 65a and a communication connector 65b, which form parts of the communication unit 38, are provided on the upper surface of the rigid portion 56a, it goes without saying that any appropriate elements capable of realizing the circuit 22 shown in FIG. 2 may be mounted on the upper surface of the rigid portion 56a. Further, the third site 20c is not limited to an application of being a rigid and flexible circuit board, and a harness constituting the wirings 24 of the circuit 22 and a circuit board may be appropriately combined.

On the other hand, the first site 20a includes the first inductor 40 and the first core member 42 of the first transformer forming unit 28, and further includes a stacked body 66 connected to the circuit board 56 and which allows the first inductor 40 to be arranged on the first core member 42.

Concerning the first core member 42, a magnetic sheet having a high magnetic permeability due to being constituted by a material such as ferrite or the like can be applied thereto. The first core member 42 extends along the first surface 16a of the main body 16, and is configured to accommodate therein the stacked body 66. More specifically, the first core member 42 includes a rectangular flat plate portion 42a extending in a planar direction of the first surface 16a, a central protrusion 42b provided at the center of the flat plate portion 42a and which projects out toward the side of the arrow A2, and an outer side protrusion 42c provided on an outer side of the flat plate portion 42a and which projects out toward the side of the arrow A2 and surrounds the outer side.

The stacked body 66 is arranged in an arrangement space 43 sandwiched between the central protrusion 42b and the outer side protrusion 42c of the first core member 42. The stacked body 66 includes the base film 58, the copper foils 60, and the cover layer 62 which are continuous with the circuit board 56. The stacked body is formed by each of the layers being fixed by a non-illustrated adhesive layer.

As shown in detail in FIGS. 3 and 4A to 4C, the base film 58 is disposed at the center of the stacked body 66 in the stacking direction. Furthermore, the stacked body 66 is constituted by printing the copper foils 60 onto both surfaces of the base film 58, and then coating the cover layer 62 which is an insulating material on an upper layer of the base film 58 and the copper foils 60. The copper foils 60 that are provided on both surfaces of the base film 58 constitute the first inductor 40 which exhibits a rectangular spiral shape.

Accordingly, the stacked body 66 of the first inductor 40 is equipped with two layers of copper wires (a first copper wire 68 and a second copper wire 70) in which the windings thereof are constructed along the planar direction of the first surface 16a. The first copper wire 68 includes a spiral portion 68a which is wound around counterclockwise from a central portion (the central protrusion 42b) toward the outer side in the planar direction, and an extending wire 68b that extends from the spiral portion 68a to the copper foils 60 (the wirings 24 connected to the first switching circuit 32) of the third site 20c. One end 68ae on a central side of the spiral portion 68a is electrically connected via a non-illustrated through hole to one end 70ae of a spiral portion 70a of the second copper wire 70. The second copper wire 70 includes the spiral portion 70a which is wound around in a clockwise direction from a central portion (the central protrusion 42b) toward the outer side in the planar direction, and an extending wire 70b that extends from the spiral portion 70a to the copper foils 60 (the wirings 24 connected to the electrode (positive electrode) inside the main body 16) of the third site 20c.

Accordingly, for example, in the case that a current has flowed from the extending wire 68b, in the first copper wire 68, the current flows in a clockwise direction from the outer side toward the central portion in the planar direction, and in the second copper wire 70, the current flows in a clockwise direction from the central portion toward the outer side in the planar direction, and the current is returned to the extending wire 70b. Consequently, the spiral portion 68a of the first copper wire 68 and the spiral portion 70a of the second copper wire 70 are capable of forming a magnetic flux in the same direction (a direction perpendicular to the planar direction of the stacked body 66).

The second site 20b, similar to the first site 20a, includes the second inductor 44 and the second core member 46 of the second transformer forming unit 30, and further includes a stacked body 72 connected to the flexible portion 56b of the circuit board 56 and which allows the second inductor 44 to be arranged on the second core member 46. The stacked body 72 having the second inductor 44 is formed in a symmetrical shape with respect to the stacked body 66 having the first inductor 40 with the main body 16 sandwiched between them, and further, the second core member 46 is formed in a symmetrical shape with respect to the first core member 42 with the main body 16 sandwiched between them. Thus, a description concerning the specific configuration of the second inductor 44 (the stacked body 72) and the second core member 46 will be omitted.

The charge transfer structure 20 is not limited to the configuration (in the form of a support member) as described above, which is installed on the main body 16 in a manner so as to partly cover the first surface 16a, the second surface 16b, and the upper surface 16c of the main body 16. For example, the charge transfer structure 20 may be a structure which is capable of being installed on upper surfaces 16c of a plurality of main bodies 16 that are stacked in the stacking direction.

Returning to FIG. 3, in a state in which the stacked body 14 is formed, the first site 20a of one of the battery cells 12 (hereinafter, referred to as a first cell 12A), and the second site 20b of another one of the battery cells 12 (hereinafter, referred to as a second cell 12B) adjacent to the one battery cell 12 are in surface contact with each other. Therefore, in the electrical energy storage device 10, when the first cell 12A passes a current through the first site 20a (or when the second cell 12B passes a current through the second site 20b), a transformer can be formed between the first cell 12A and the second cell 12B.

As shown in FIG. 2, under the control of the control unit 80, by appropriately forming transformers between the adjacent battery cells 12, the electrical energy storage device 10 causes the electrical charge (electrical energy indicated by cell voltage) of each of the battery cells 12 to transfer. The control unit 80 is configured in a computer having a processor, a memory, and an input/output interface (including a communication functional unit), none of which are shown, and is installed, for example, in a casing in which the battery cells 12 are accommodated. The control unit 80 is connected so as to be capable of communicating information with respect to the communication units 38 of the respective battery cells 12 via the communication lines 82 (see FIG. 2).

Figure 5A:
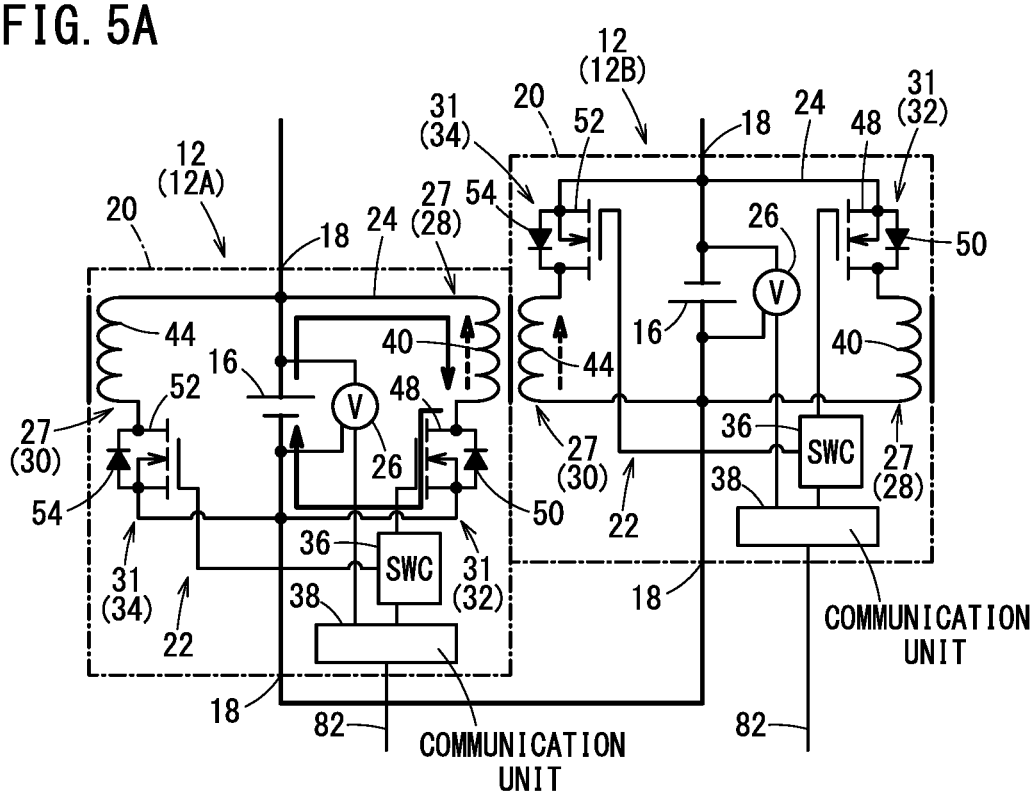
FIG. 5A is a circuit diagram showing an on-stage operation of a first switching circuit.
Figure 5B:
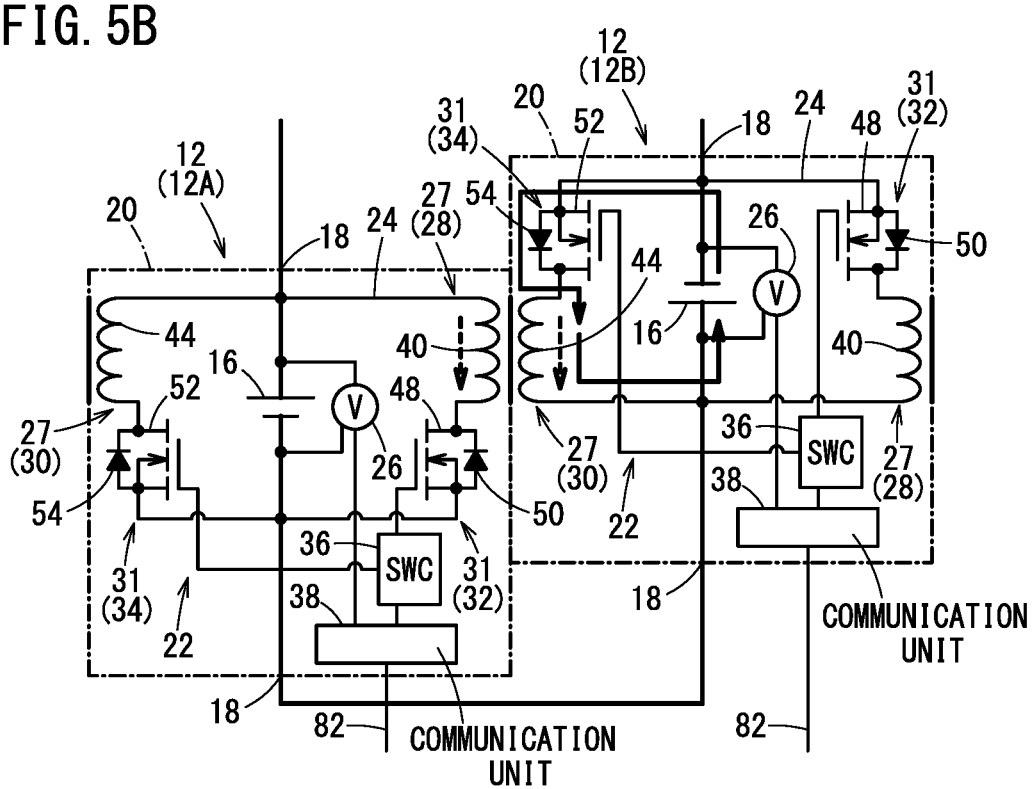
FIG. 5B is a circuit diagram showing an off-stage operation of the first switching circuit.

As shown in FIGS. 5A and 5B, the control unit 80 transfers electrical charge (electrical energy) between the first cell 12A and the second cell 12B using the transformer, by appropriately switching the switching circuit 31 on the supply side on and off. More specifically, the control unit 80 alternately repeats an on-stage in which energy is stored in the transformer from the battery cell 12 on the supply side, and an off-stage in which the stored energy is transferred from the transformer to the battery cell 12 on the electrical energy storage side. Hereinafter, a description will be given of on-stage and off-stage operations in relation to a case in which electrical charge (electrical energy) is transferred from the first cell 12A to the second cell 12B.

In the on-stage, the control unit 80 switches from the off state in which voltage is not applied to the gate of the first FET 48 of the first cell 12A, to an on state in which a voltage is applied to the gate. In this instance, in the off state, the first FET 48 interrupts the flow of electric current between the source and the drain, and therefore, current does not flow to the first inductor 40. In contrast thereto, in the on state, the first FET 48 opens the channel between the source and the drain, and therefore, current flows to the first inductor 40 on the primary side.

Therefore, by the current flowing in a predetermined direction (spiral direction) of the first inductor 40, a potential is generated in the first inductor 40 in a direction that impedes a change in the current. For example, in FIG. 5A, a potential which is generated in an upward direction of the first inductor 40 is indicated by a dotted arrow. Accompanying the upwardly directed potential in the first inductor 40, an upwardly directed potential is also generated in the second inductor 44 on the secondary side.

However, in the on-stage, the control unit 80 continues the off state in which voltage is not applied to the gate of the second FET 52 of the second cell 12B. Therefore, the second FET 52 shuts off the flow of electric current between the source and the drain, and does not allow the current to flow through the circuit 22 (the main body 16, the second inductor 44, and the second FET 52, etc.) on the secondary side. As a result, the electrical potential (energy) generated in the first inductor 40 is accumulated in the first core member 42 of the first cell 12A and the second core member 46 of the second cell 12B that form the transformer.

Next, in the off-stage, the control unit 80 switches the first FET 48 of the first cell 12A from the on state to the off state. Consequently, the first FET 48 suspends the current between the source and the drain. When the first FET 48 is placed in the off state, a potential is generated, in the transformer, in the reverse direction so as to prevent the current from stopping. For example, in FIG. 5B, a potential which is generated in a downward direction of the first inductor 40 is indicated by a dotted arrow.

Since the first FET 48 on the primary side is in the off state, the energy stored in the first and second core members 42 and 46 is released to the circuit 22 on the secondary side. Based on the downwardly directed potential in the first inductor 40, a downwardly directed potential is also generated in the second inductor 44 on the secondary side. The potential of the second inductor 44 is greater than the potential of the main body 16 on the electrical energy storage side. Therefore, the stored energy flows through the circuit 22 on the secondary side (the electrode (negative electrode) inside the main body 16, the second diode 54, the second inductor 44, and the electrode (positive electrode) inside the main body 16), and charges the main body 16.

In the control unit 80, the on-stage and the off-stage are repeated for short periods of time and alternately, whereby the electrical charge (electrical energy) is transferred from the first cell 12A on the side of the high cell voltage to the second cell 12B on the side of the low cell voltage. At this time, the control unit 80 maintains the time ratio Duty (=T1/(T1+T2)) between the on-stage execution period T1 and the off-stage execution period T2 constant, whereby the amount of electrical charge transferred per unit time (the change amount of cell voltage per unit time) is controlled to be the same amount. Consequently, the potential of the first cell 12A gradually decreases from a state in which the potential of the first cell 12A is higher than the potential of the second cell 12B, whereas the potential of the second cell 12B gradually increases, and the potentials become substantially the same after a certain amount of time.

Figure 6A:
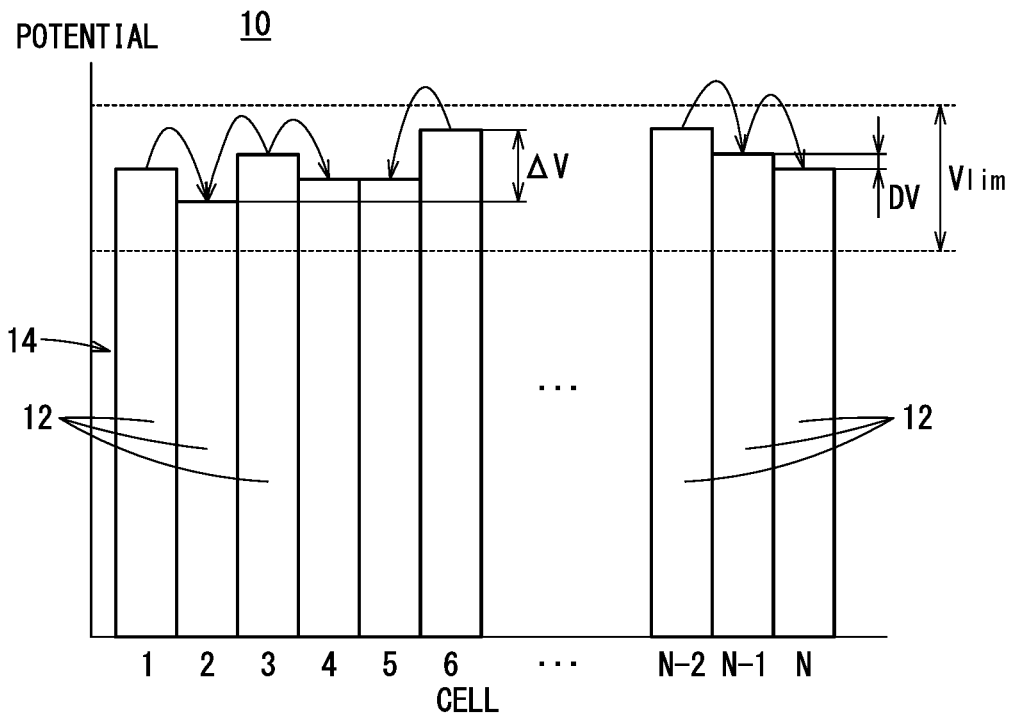
FIG. 6A is an explanatory diagram showing movement of electrical charge between a plurality of battery cells in an equalization control.
Figure 6B:
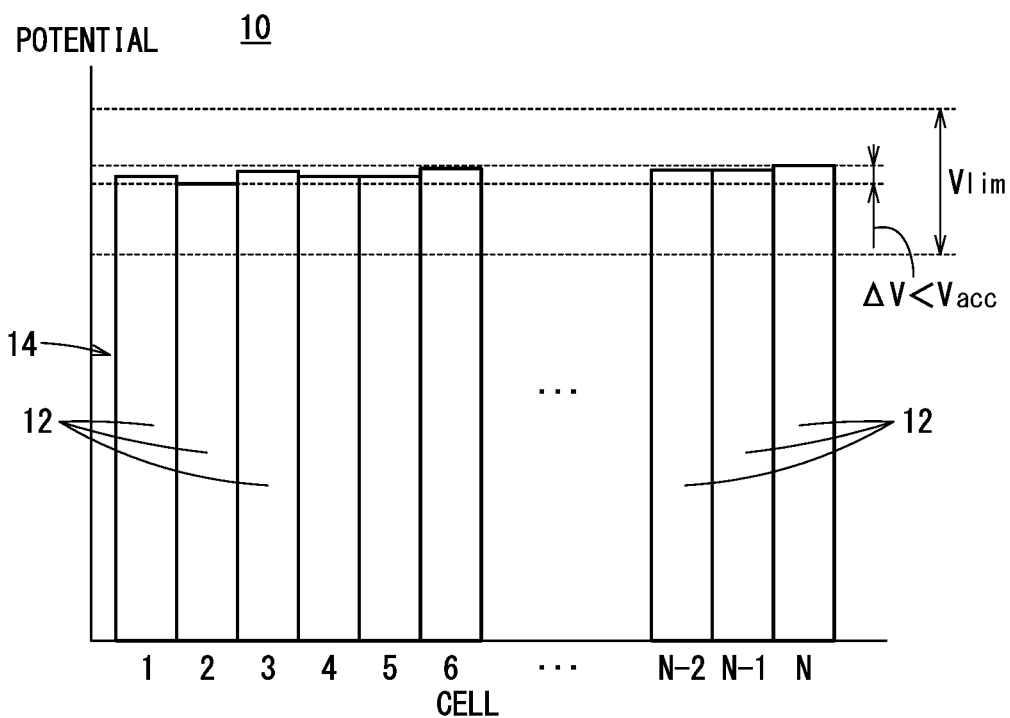
FIG. 6B is an explanatory diagram showing the potential states of the plurality of battery cells following completion of the equalization control.

By the control unit 80 carrying out transferring of the electrical charge (electrical energy) with respect to all of the plurality of battery cells 12 each having the above circuit 22, as shown in FIGS. 6A and 6B, the equalization control is implemented in which the cell voltages amongst the respective battery cells 12 are equalized. For example, the control unit 80 performs the equalization control by appropriately determining a condition in which the variation in potential is small between the battery cells 12, such as during a period when the vehicle is stopped and the ignition is off or the like. Moreover, the start timing of the equalization control can be arbitrarily set, and may take place during a period when the vehicle is traveling.

In the equalization control, the control unit 80 detects all of the potentials of the respective battery cells 12 by the potential detection unit 26 of each of the battery cells 12, and from the measurement results thereof, compares the potentials of the battery cells 12 lying adjacent to each other. In addition, for the mutually adjacent battery cells 12, the control unit 80 carries out transferring of the electrical charge from the battery cell 12 having a higher potential to the battery cell 12 having a lower potential.

Next, with reference to FIGS. 7A to 7D, a description will be given concerning an example of movement of electrical charge (equalization of cell voltages) in a number (five) of the battery cells 12. Hereinafter, the five battery cells 12 will be simply referred to as cell 1, cell 2, cell 3, cell 4, and cell 5, in order from the left (the side of the arrow A1) to the right (the side of the arrow A2).

Figure 7A:
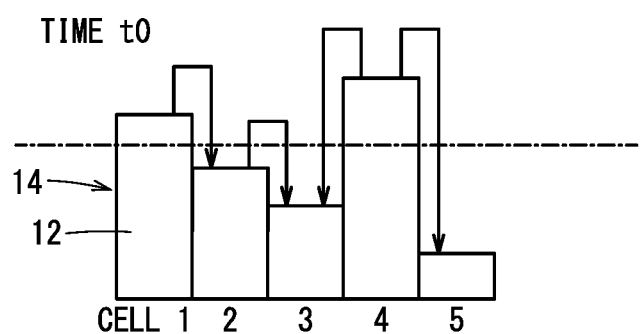
FIG. 7A is a first explanatory diagram showing an example of movement of electrical charge between five battery cells.
Figure 7B:
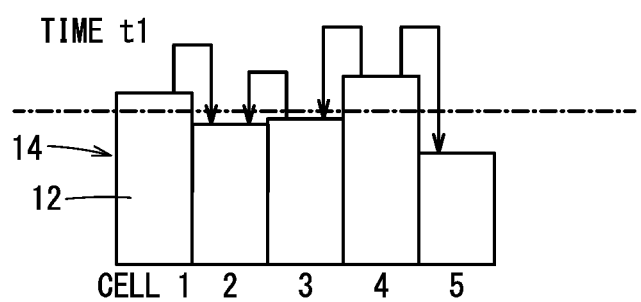
FIG. 7B is a second explanatory diagram showing an example of movement of electrical charge between five battery cells.

At time t0 shown in FIG. 7A, in the case that the inequality "potential of cell 1>potential of cell 2>potential of cell 3" is satisfied, with the charge of cell 1 being directed toward cell 2, and the charge of cell 2 being directed toward cell 3, the charges are moved in the form of a bucket brigade. If the potential of cell 4 is higher than the potentials of the adjacent cells 3 and 5, the electrical charge of cell 4 is distributed both to the left and to the right (to cell 3 and to cell 5).

At time t1 after a certain amount of time has passed from time t0 (refer to FIG. 7B), in the case that the inequality "potential of cell 1>potential of cell 2" is satisfied, and the inequality "potential of cell 2<potential of cell 3" is satisfied, the electrical charges of cell 1 and cell 3 are transferred to cell 2. Further, if the state in which the potential of cell 4 is higher than the potentials of cell 3 and cell 5 continues, the distribution of the electrical charge of cell 4 with respect to cell 3 and cell 5 is continued.

Figure 7C:
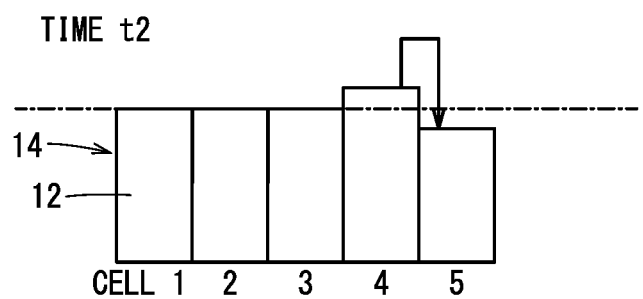
FIG. 7C is a third explanatory diagram showing an example of movement of electrical charge between five battery cells.

Consequently, at time t2 after another certain amount of time has elapsed from time t1 (refer to FIG. 7C), the potential of cell 1, the potential of cell 2, and the potential of cell 3 arrive at substantially the same potential (potential after equalization AV: one-dot-dashed line in FIG. 7C). If the potential of cell 4 is higher than the potential of cell 5 even at this time t2, the electrical charge of cell 4 is transferred to cell 5.

Figure 7D:
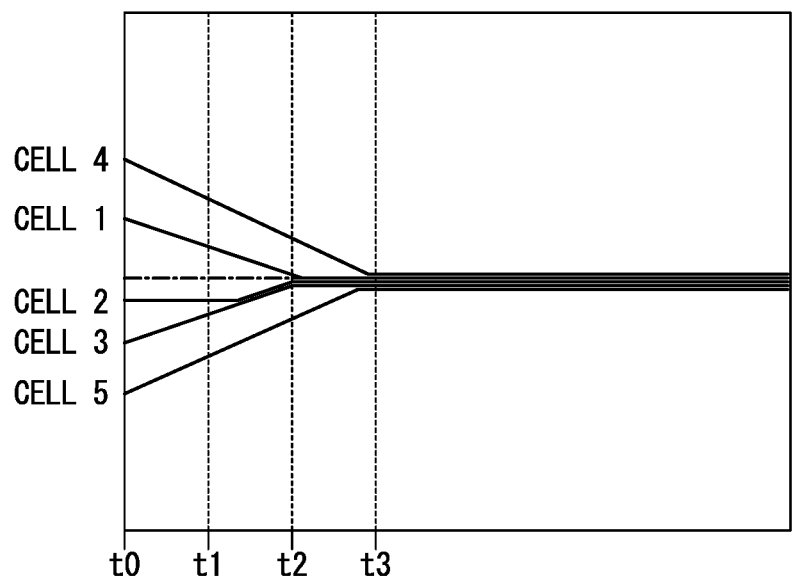
FIG. 7D is a graph showing changes in potentials of the five battery cells.

More specifically, as shown in FIG. 7D, in the equalization control, the potentials of cells 1 to 5 gradually change so as to gather around the potential after equalization AV over the passage of time. Then, at time t3 and thereafter, the potentials of cells 1 to 5 become substantially of the same degree in the vicinity of the potential after equalization AV, and such a state is maintained.

Moreover, as shown in FIG. 6A, the control unit 80 stores in advance a limited range $V_{lim}$ of potentials within which the cell voltages do not become in a state of excessive voltage or excessive discharging, and performs the equalization control with respect to the battery cells 12 having potentials within the limited range $V_{lim}$. On the other hand, in the case that a battery cell 12 is recognized having a potential outside of the limited range $V_{lim}$, the control unit 80 does not perform the equalization control on such a battery cell 12.

Consequently, it is possible to avoid performing charging on a battery cell 12 that is in a state of being excessively charged, or alternatively, to avoid carrying out discharging of a battery cell 12 that is in a state of being excessively discharged.

Further, as shown in FIG. 6B, the control unit 80 stores in advance an allowable potential range $V_{acc}$ which allows a deviation in the potential of each of the battery cells 12 in the equalization control. More specifically, when a deviation $\Delta V$ (potential difference) obtained by subtracting the maximum value and the minimum value of the battery cells 12 is greater than the allowable potential range $V_{acc}$, the control unit 80 carries out transferring of the electrical charge between the battery cells 12. On the other hand, when the deviation $\Delta V$ lies within the allowable potential range $V_{acc}$, the control unit 80 stops the transferring of the electrical charge between the battery cells 12. Consequently, the control unit 80 can terminate the equalization control as soon as possible, at a stage when the potentials of the respective battery cells 12 have become close to each other to a certain extent (the potentials of the respective battery cells 12 do not coincide with each other).

The electrical energy storage device 10 according to the present embodiment is basically configured in the manner described above. Hereinafter, an example of a process flow for the equalization control will be described with reference to FIGS. 8 and 9.

The control unit 80 of the electrical energy storage device 10 constantly monitors the establishment of an equalization control starting condition, and when it is determined that the starting condition has been satisfied, the process flow for the equalization control is executed. In the equalization control, at first, the control unit 80 initializes the information (the potentials of the respective battery cells 12, the deviation $\Delta V$ (potential difference), etc.) that has been acquired or calculated up to that point (step S1).

Next, the control unit 80 receives via the communication unit 38 the measurement results (potential information) measured by the potential detection unit 26 of each of the battery cells 12 and stores them in the memory (step S2). At this time, the control unit 80 acquires the potentials of all of the plurality of battery cells 12.

Using the acquired measurement results, the control unit 80 extracts a maximum potential value $V_{cell\_max}$ and a minimum potential value $V_{cell-min}$ from among the battery cells 12 (step S3). Furthermore, the control unit 80 calculates the potential deviation $\Delta V$ (potential difference) of the stacked body 14 as a whole, by subtracting the extracted minimum value from the extracted maximum value $V_{cell-ma}$. (step S4).

Steps S1 to S4 are preparatory steps for the equalization control, and thereafter, the control unit 80 executes a cell control step for controlling transfer of the electrical charge amongst the adjacent battery cells 12.

In the cell control step, at first, the control unit 80 determines whether or not the cell control step has been executed with respect to all of the plurality of battery cells 12 (step S5). In the case that the cell control step has been executed in relation to all of the battery cells 12, the control unit 80 terminates the equalization control for the present time. On the other hand, in the case of there still being a battery cell 12 on which the cell control step has not been executed, the process proceeds to step S6.

In step S6, the control unit 80 carries out an incrementing process in order to change the battery cell 12 to be controlled, to the adjacent battery cell 12. For example, the control unit 80 is set beforehand so as to sequentially control the circuits 22 of the battery cells 12 from the battery cell 12 at one end in the stacking direction (on the side of the arrow A1) toward the battery cell 12 at the other end in the stacking direction (on the side of the arrow A2).

In addition, the control unit 80 compares the potential $V_{cell(i)}$ of a target battery cell 12 (hereinafter, designated by the reference numeral 12(*i*) for the sake of convenience) with the potential $V_{cell(i-1)}$ of a battery cell 12 (hereinafter, designated by the reference numeral 12(*i*−1) for the sake of convenience) adjacent to the battery cell 12(*i*) (step S7). In such a comparison, in the case that $V_{cell(i)} > V_{cell(i-1)}$, the process proceeds to step S8, while conversely, in the case that $V_{cell(i)} < V_{cell(i-1)}$ the process proceeds to step S11. Moreover, in the case that $V_{cell(i)} = V_{cell(i-1)}$ step S7 is brought to an end, and a process of returning to step S5 may be carried out.

Steps S8 to S10 relate to controlling the battery cell 12(*i*) on the high potential side, and controlling the battery cell 12(*i*−1) on the low potential side. In step S8, the control unit 80 performs a determination as to whether or not the previously calculated deviation $\Delta V$ lies outside of the allowable potential range $V_{acc}$, and a determination as to whether or not the potential $V_{cell(i)}$ of the battery cell $12(i)$ and the potential $V_{cell(i-1)}$ of the battery cell $12(i-1)$ lie within the limited range $V_{lim}$. In the case that $\Delta V \ V_{acc}$, and further, $V_{cell(i)}$ and $V_{cell(i-1)}$ fall within $V_{lim}$, the process proceeds to step S9. On the other hand, in the case that any one of $\Delta V < V_{acc}$, $V_{cell(i)}$ being outside of $V_{lim}$, and $V_{cell(i-1)}$ being outside of $V_{lim}$ is satisfied, the process proceeds to step S10.

In step S9, the control unit 80 performs a control to transfer the electrical charge (electrical energy) of the battery cell $12(i)$ to the battery cell $12(i-1)$. More specifically, from among the switching circuits 31 of the battery cell $12(i)$, the control unit 80 repeatedly performs a control (the aforementioned on-stage and off-stage) of switching on or off the switching circuit 31 that faces toward the battery cell $12(i-1)$. The control unit 80 continues repeating the on-stage and the off-stage for a predetermined time period (on the order of several µs to several seconds). Consequently, a prescribed amount of the electrical charge (electrical energy) of the battery cell $12(i)$ is transferred via the transformer to the battery cell $12(i-1)$.

On the other hand, in step S10, the control unit 80 does not switch the switching circuits 31 of the battery cell $12(i)$ between on and off, whereby movement of the electrical charge from the battery cell $12(i)$ to the battery cell $12(i-1)$ is not executed. Consequently, unnecessary transferring of the electrical charge between the battery cell $12(i)$ and the battery cell $12(i-1)$ is avoided. In addition, after completion of step S9 or step S10, the control unit 80 returns to step S5, and thereafter, the same process flow is executed.

Further, steps S11 to S13 relate to controlling the battery cell $12(i-1)$ on the high potential side, and controlling the battery cell $12(i)$ on the low potential side. In step S11, similar to step S8, the control unit 80 performs a determination as to whether or not the deviation $\Delta V$ lies outside of the allowable potential range $V_{acc}$, and a determination as to whether or not the potential $V_{cell(i)}$ of the battery cell $12(i)$ and the potential $V_{cell(i-1)}$ of the battery cell $12(i-1)$ lie within the limited range $V_{lim}$. In the case that $\Delta V \ V_{acc}$, and further, $V_{cell(i)}$ and $V_{cell(i-1)}$ lie within the limited range $V_{lim}$, the process proceeds to step S12. On the other hand, in the case that any one of $\Delta V < V_{acc}$, $V_{cell(i)}$ being outside of $V_{lim}$, and $V_{cell(i-1)}$ being outside of $V_{lim}$ is satisfied, the process proceeds to step S13.

In step S12, the control unit 80 performs a control to cause the electrical charge of the battery cell $12(i-1)$ to be moved to the battery cell $12(i)$. More specifically, from among the switching circuits 31 of the battery cell $12(i-1)$, the control unit 80 repeatedly performs a control (the aforementioned on-stage and off-stage) of switching on or off the switching circuit 31 that faces toward the battery cell $12(i)$. The control unit 80 continues repeating the on-stage and the off-stage for a predetermined time period (on the order of several µs to several seconds). Consequently, a prescribed amount of the electrical charge of the battery cell $12(i-1)$ is moved via the transformer to the battery cell $12(i)$.

On the other hand, in step S13, the control unit 80 does not switch the switching circuit 31 of the battery cell $12(i-1)$ between on and off, whereby movement of the electrical charge from the battery cell $12(i-1)$ to the battery cell $12(i)$ is not executed. Further, after completion of step S12 or step S13, the control unit 80 returns to step S5, and thereafter, the same process flow is executed.

According to the above-described process flow, the control unit 80 transfers the electrical charge of all of the plurality of battery cells 12 as necessary. As a result, equalization of the potentials of the respective battery cells 12 is promoted. Further, after completion of the above-described process flow, in the case that a potential difference is still generated between the battery cells 12, the control unit 80 carries out the process again from step S1. By executing the process flow a plurality of times (for example, at each of times t0 to t3 in FIG. 7D), the electrical energy storage device 10 ultimately makes the potentials between the respective battery cells 12 substantially the same.

It should be noted that the equalization control executed by the electrical energy storage device 10 is not necessarily limited to the above-described process flow. For example, instead of the process flow shown in FIG. 9, the control unit 80 may execute the process flow shown in FIG. 10.

More specifically, the control unit 80 initially determines whether or not the deviation $\Delta V$, which was calculated in step S4 of FIG. 8, lies outside of the allowable potential range $V_{acc}$ ($\Delta V \geq V_{acc}$) (step S21). Then, if the deviation $\Delta V$ lies outside of the allowable potential range $V_{acc}$, the process proceeds to step S22. On the other hand, in the case that the deviation $\Delta V$ lies within the allowable potential range $V_{acc}$ ($\Delta V < V_{acc}$) since it can be said that the equalization control of the battery cells 12 does not have to be performed, the process flow at this time is brought to an end.

Figure 9:
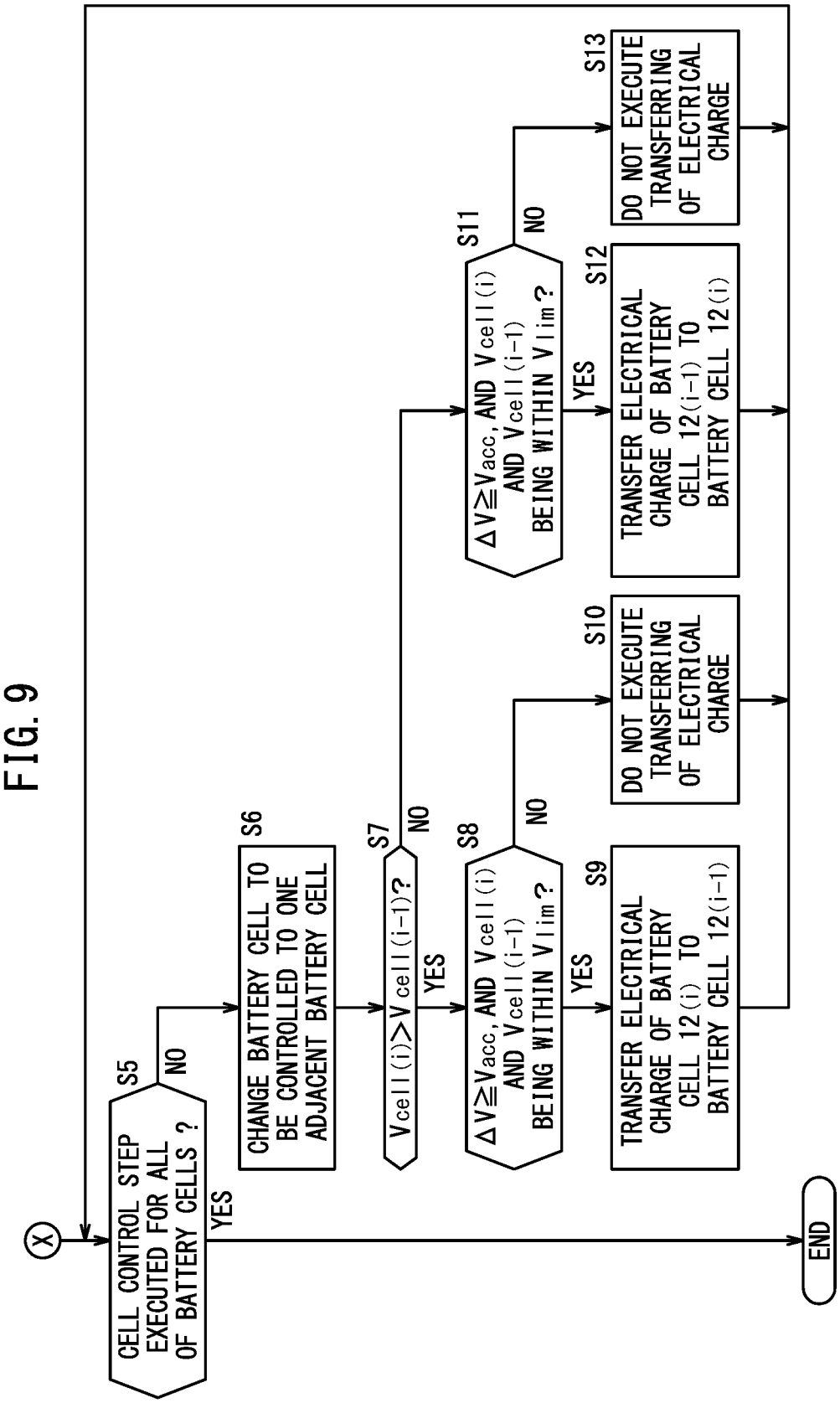
FIG. 9 is a flowchart showing another portion of the process flow of the equalization control.
Figure 10:
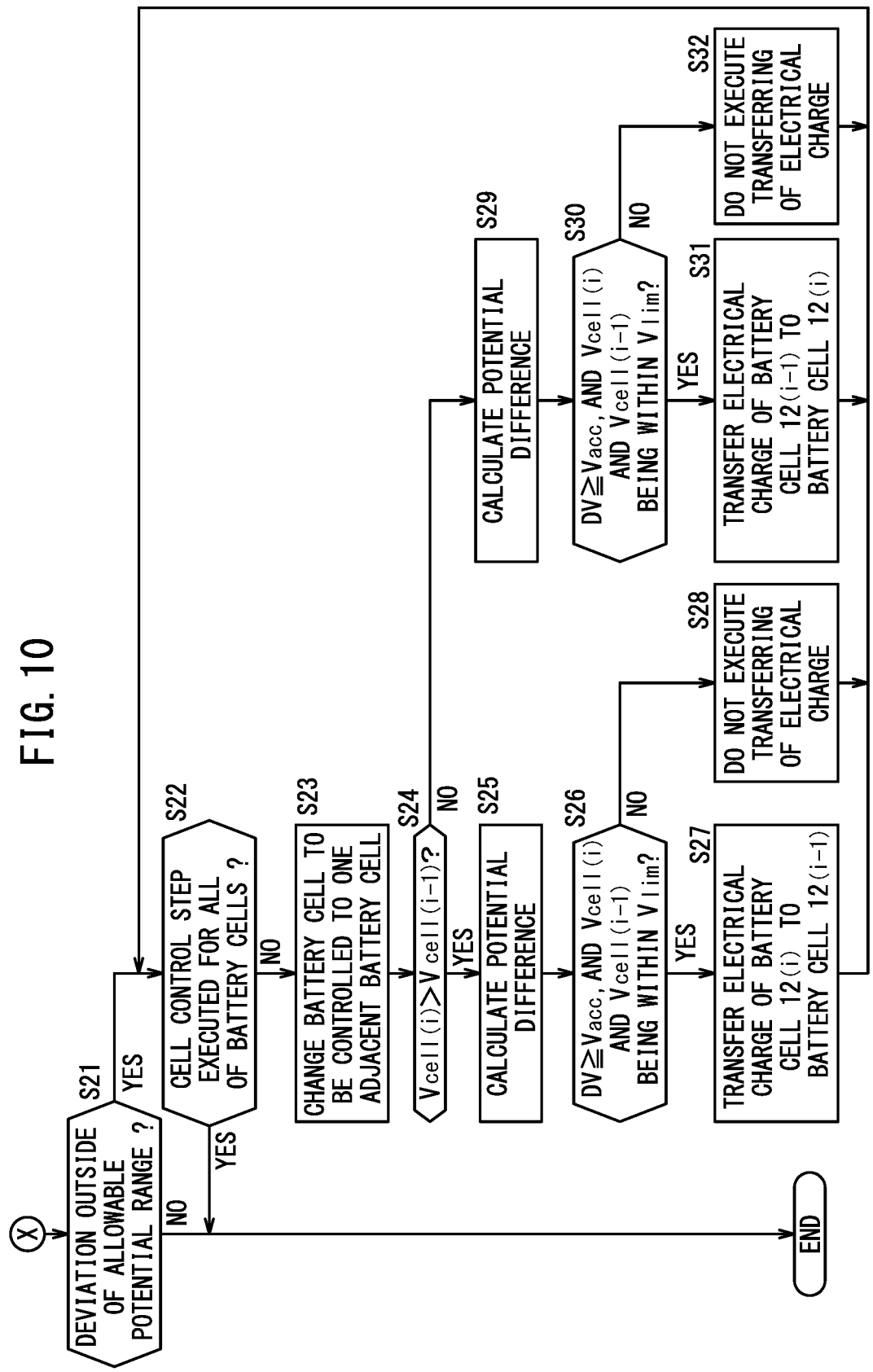
FIG. 10 is a flowchart showing another portion of the process flow of the equalization control according to another embodiment.

Further, steps S22 to S24 carry out the same or similar processes as the process flow of steps S5 to S7 of FIG. 9. In step S24, in the case that $V_{cell(i)} > V_{cell(i-1)}$, the process proceeds to step S25, while conversely, in the case that $V_{cell(i)} < V_{cell(i-1)}$ the process proceeds to step S29. Moreover, in the case that $V_{cell(i)} = V_{cell(i-1)}$, step S24 is brought to an end, and a process of returning to step S21 may be carried out.

In step S25, the control unit 80 calculates the potential difference DV (see FIG. 6A), which is obtained by subtracting the potential $V_{cell(i-1)}$ of the battery cell $12(i-1)$ from the potential $V_{cell(i)}$ of the battery cell $12(i)$. In addition, the control unit 80 performs a determination as to whether or not the calculated potential difference DV lies outside of the allowable potential range $V_{acc}$ and a determination as to whether or not the potential $V_{cell(i)}$ of the battery cell $12(i)$ and the potential $V_{cell(i-1)}$ of the battery cell $12(i-1)$ lie within the limited range $V_{lim}$ (step S26). In the case that $DV \geq V_{acc}$ and further, $V_{cell(i)}$ and $V_{cell(i-1)}$ lie within $V_{lim}$, the process proceeds to step S27. On the other hand, in the case that any one of $DV < V_{acc}$, $V_{cell(i)}$ being outside of $V_{lim}$, and $V_{cell(i-1)}$ being outside of $V_{lim}$ is satisfied, the process proceeds to step S28.

Step S27 is the same process as step S9 of FIG. 9, and in accordance with this step, the electrical charge of the battery cell $12(i)$ is transferred to the battery cell $12(i-1)$. Step S28 is the same process as step S10 of FIG. 9, and in accordance with this step, unnecessary movement of the electrical charge between the battery cell $12(i)$ and the battery cell $12(i-1)$ is avoided.

Further, in step S29, the control unit 80 calculates the potential difference DV, which is obtained by subtracting the potential $V_{cell(i)}$ of the battery cell $12(i)$ from the potential $V_{cell(i-1)}$ of the battery cell $12(i-1)$. In addition, the control unit 80 performs a determination as to whether or not the calculated potential difference DV lies outside of the allowable potential range $V_{acc}$, and a determination as to whether or not the potential $V_{cell(i)}$ of the battery cell $12(i)$ and the potential $V_{cell(i-1)}$ of the battery cell $12(i-1)$ lie within the limited range $V_{lim}$ (step S30). In the case that $DV \ V_{acc}$ and further, $V_{cell(i)}$ and $V_{cell(i-1)}$ lie within $V_{lim}$, the process proceeds to step S31. On the other hand, in the case that any one of $DV<V_{acc}$, $V_{cell(i)}$ being outside of $V_{lim}$, and $V_{cell(i-1)}$ being outside of $V_{lim}$ is satisfied, the process proceeds to step S32.

Step S31 is the same process as step S12 of FIG. 9, and in accordance with this step, the electrical charge of the battery cell 12(i–1) is transferred to the battery cell 12(i). Step S32 is the same process as step S13 of FIG. 9, and in accordance with this step, unnecessary transferring of the electrical charge between the battery cell 12(i) and the battery cell 12(i–1) is avoided.

In the foregoing manner, the electrical energy storage device 10 may be configured in a manner so as to separately calculate the potential differences DV amongst the mutually adjacent battery cells 12(i) and 12(i–1), and compare each of the potential differences DV with the allowable potential range $V_{acc}$, and further, to carry out transferring of the electrical charge in the case that the potential difference DV lies outside of the allowable potential range $V_{acc}$. Consequently, the electrical energy storage device 10 is capable of accurately carrying out transferring of the electrical charge in accordance with the potential differences DV amongst the adjacent battery cells 12.

In the foregoing manner, by means of the charge (energy) transfer structures 20 installed in the main bodies 16, the electrical energy storage device 10 according to the first embodiment is capable of transferring electrical charge (electrical energy) between the plurality of adjacent battery cells 12. In addition, the control unit 80 is capable of appropriately distributing the potentials amongst the plurality of battery cells 12, by appropriately controlling the transformer forming units 27 of the plurality of battery cells 12. In particular, by the transformer forming units 27, including the first inductor 40 and the second inductor 44 that make up windings in the surface direction of the main body 16, being formed in a plate shape, the length of the electrical energy storage device 10 in the stacking direction can be made as short as possible. Further, the charge transfer structure 20 is constituted as a U-shaped support member that enables the transformer forming units 27 to be easily arranged respectively on the first surface 16a and the second surface 16b of the main body 16, thereby facilitating the installation operation and the like. Furthermore, at the time of controlling the on or off states of the switching circuits 31, by maintaining the time ratio Duty constant, the control unit 80 is capable of preventing the potentials of the respective battery cells 12 from overshooting or undershooting.

Second Embodiment

Figure 11A:
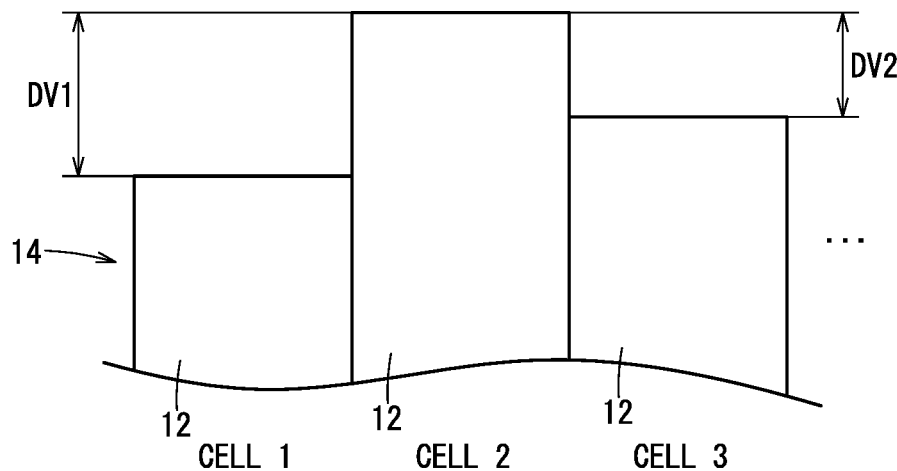
FIG. 11A is a first explanatory diagram showing an example of movement of electrical charge between battery cells of an electrical energy storage device according to a second embodiment.
Figure 11B:
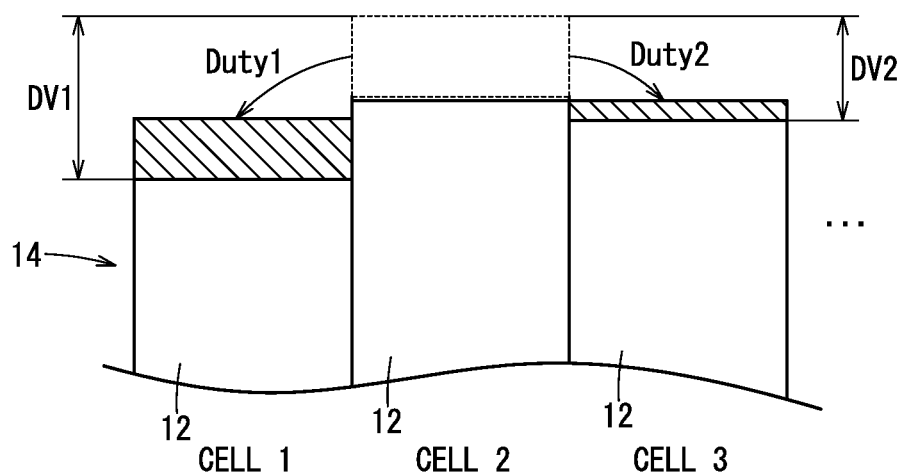
FIG. 11B is a second explanatory diagram showing an example of movement of electrical charge between battery cells of the electrical energy storage device according to the second embodiment.

As shown in FIGS. 11A and 11B, an electrical energy storage device 10A according to a second embodiment differs from the electrical energy storage device 10 according to the first embodiment, in that the time ratio Duty of the on-stage and the off-stage of the switching circuits 31 is made to change in accordance with the potential difference DV. Moreover, other constituent features of the electrical energy storage device 10A are the same as those of the electrical energy storage device 10, and detailed description of such features will be omitted.

More specifically, the control unit 80 (see FIG. 2) of the electrical energy storage device 10A adjusts the time ratio Duty in accordance with the potential difference DV between the mutually adjacent battery cells 12. When three of the battery cells 12, as shown in FIGS. 11A and 11B, are described as an example, in FIG. 11A, at a time prior to execution of the equalization control, a state is brought about in which the potential of cell 2 is higher than the potential of cell 1 and the potential of cell 3. Accordingly, in the equalization control, the electrical charge is transferred from cell 2 to cell 1 and cell 3.

In this instance, when the potential of cell 1 and the potential of cell 3 are compared, the potential of cell 3 is higher than the potential of cell 1. Stated otherwise, the potential difference DV1 between cell 1 and cell 2 is greater than the potential difference DV2 between cell 2 and cell 3. In this case, the control unit 80 makes a time ratio Duty1 for transferring the electrical charge from cell 2 to cell 1 greater than a time ratio Duty2 for transferring the electrical charge from cell 2 to cell 3. Consequently, the electrical charge directed from cell 2 toward cell 1 becomes greater than the electrical charge directed from cell 2 toward cell 3.

Figure 12:
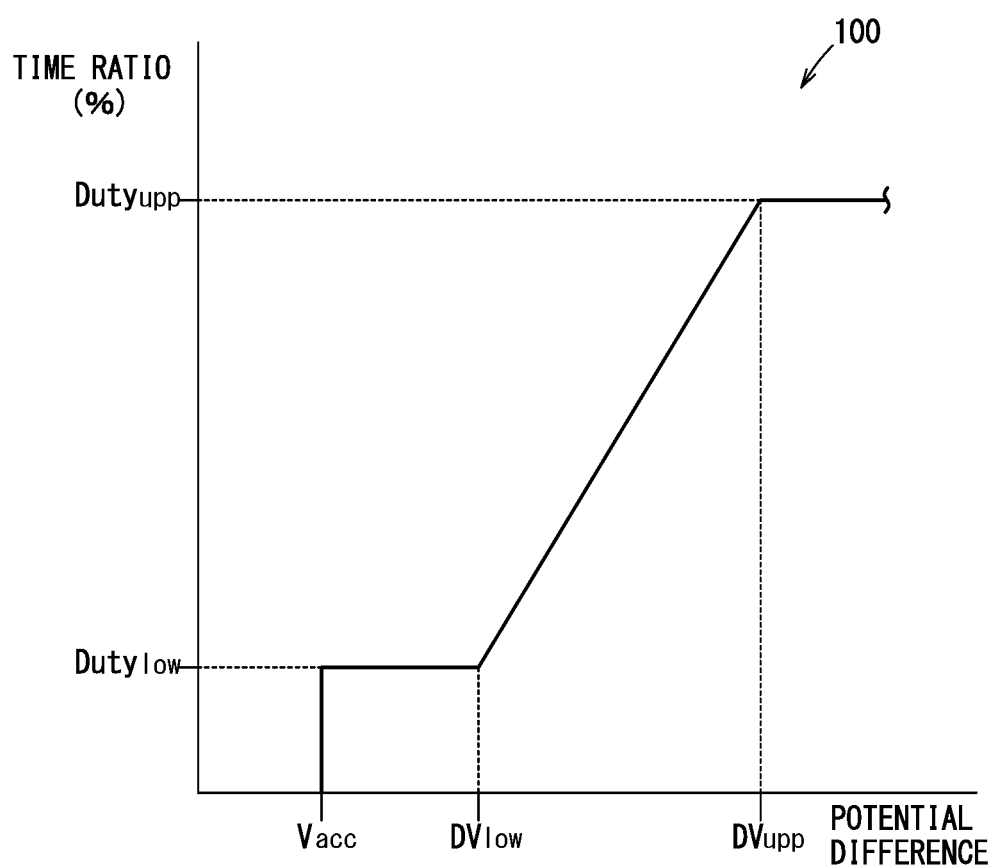
FIG. 12 is a graph illustrating an example of map information for the purpose of setting a time ratio.

Stated otherwise, in the equalization control, the control unit 80 switches the switching circuits 31 between on and off at the time ratio Duty in accordance with the potential difference DV between the adjacent battery cells 12. Therefore, as shown in FIG. 12, the control unit 80 stores (retains) in advance a function or map information 100 indicating a relationship between the potential difference DV and the time ratio Duty.

For example, in the map information 100, in the case that the potential difference DV is less than the allowable potential range $V_{acc}$, the time ratio Duty is zero. Further, in an interval of the potential difference DV between the allowable potential range $V_{acc}$ and a predetermined lower limit value $DV_{low}$, the time ratio Duty is kept at a constant value, i.e., the lower limit time ratio $Duty_{low}$, in order to assure a certain amount of the cell voltage.

In an interval of the potential difference DV between the lower limit value $DV_{lo}$ and a predetermined upper limit value $DV_{upp}$, the time ratio Duty increases linearly as the potential difference DV becomes larger. The rate of increase (slope) of the time ratio Duty is set at an appropriate constant value by way of an experiment, a simulation, or the like. By multiplying the potential difference DV by such a constant value, the control unit 80 calculates the time ratio Duty between the lower limit value $DV_{lo}$ and the upper limit value $DV_{upp}$.

In addition, the time ratio Duty reaches the upper limit time ratio $Duty_{upp}$ at the upper limit value $DV_{upp}$. In the map information 100, when the potential difference DV becomes greater than the upper limit value $DV_{upp}$, the time ratio Duty is kept constant at the upper limit time ratio $Duty_{upp}$. When calculating the potential difference DV between the adjacent battery cells 12, the control unit 80 reads out the above-described function (constant) or the map information 100 of the potential difference DV, and sets the time ratio Duty corresponding to the potential difference DV.

Figure 13:
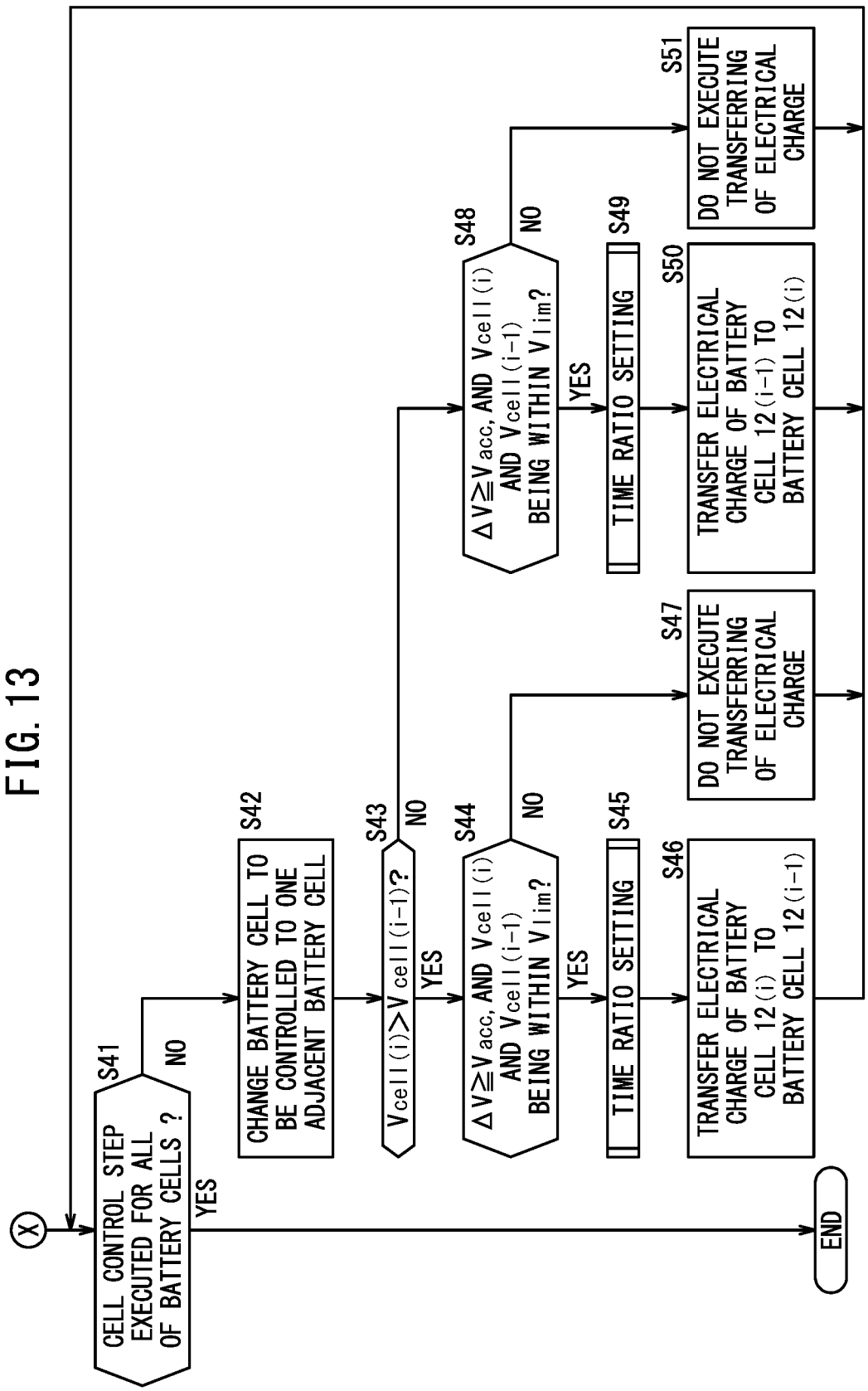
FIG. 13 is a flowchart showing another portion of the process flow of the equalization control in the electrical energy storage device according to the second embodiment.
Figure 14:
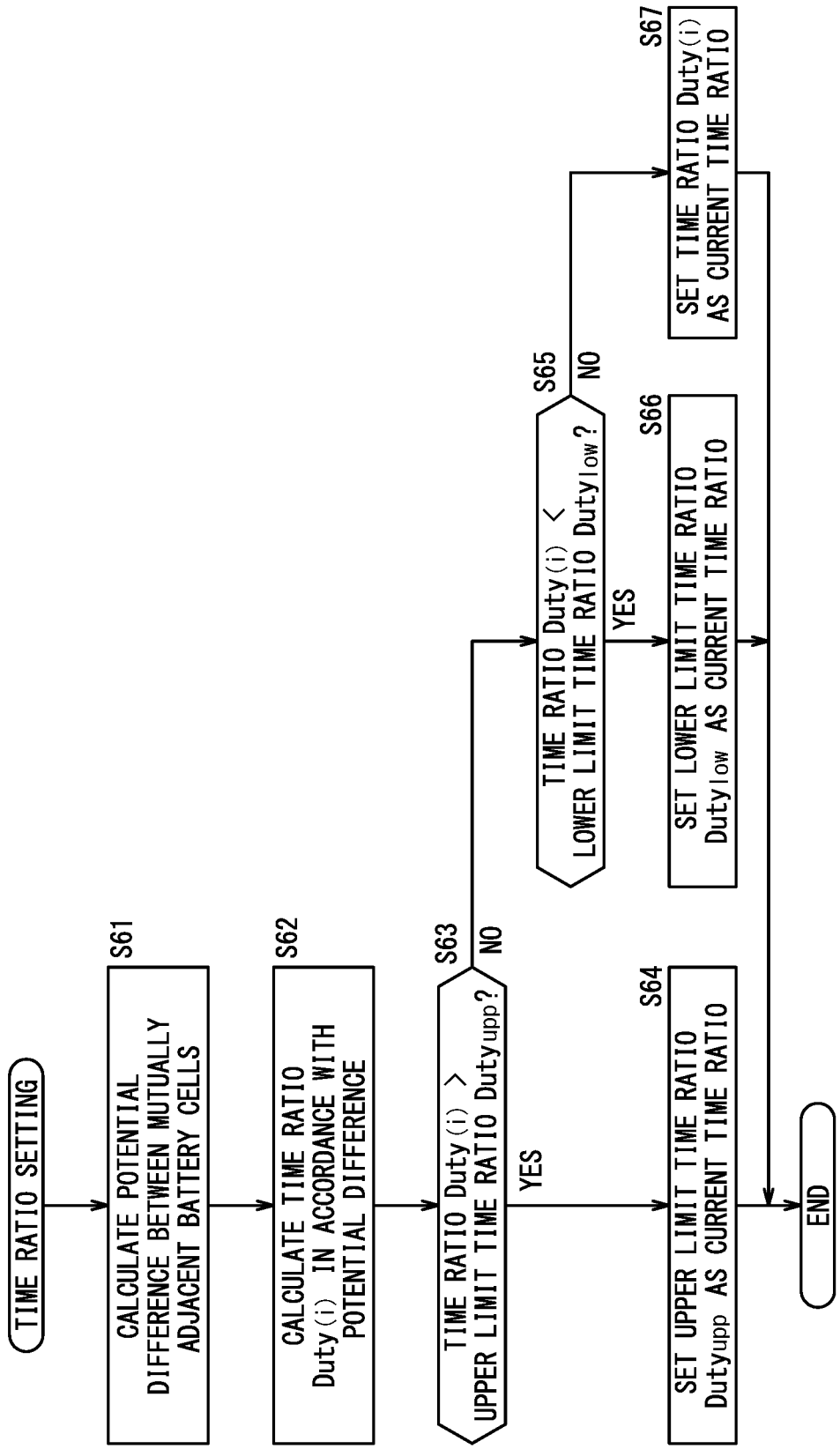
FIG. 14 is a flowchart showing a process flow of a time ratio setting subroutine.

Next, in relation to the electrical energy storage device 10A according to the second embodiment, an example of the equalization control process flow will be described. In the equalization control, after having executed the process flow shown in FIG. 8, the electrical energy storage device 10A executes the process flow of FIGS. 13 and 14. Steps S41 to S44 of FIG. 13 carry out the same or similar processes as the process flow of steps S5 to S8 of FIG. 9. In step S44, in the case that $\Delta V \geq V_{acc}$, and further, $V_{cell(i)}$ and $V_{cell(i-1)}$ lie within $V_{lim}$, the process proceeds to step S45. On the other hand, in the case that any one of $\Delta V<V_{acc}$, $V_{cell(i)}$ being outside of $V_{lim}$, and $V_{cell(i-1)}$ being outside of $V_{lim}$ is satisfied, the process proceeds to step S47.

In step S45, the control unit 80 executes a time ratio setting subroutine. In the time ratio setting subroutine of FIG. 14, the control unit 80 uses a function to set the time ratio Duty. In such a process flow, at first, the control unit 80 calculates the potential difference DV between the battery cell 12(*i*) and the battery cell 12(*i*−1) that are adjacent to each other (step S61).

Next, the control unit 80 calculates a time ratio Duty(i) in accordance with the potential difference DV, by multiplying the calculated potential difference DV by a predetermined constant (slope) (step S62). Furthermore, the control unit 80 determines whether or not the calculated time ratio Duty(i) is greater than a previously retained upper limit time ratio $Duty_{upp}$ (step S63). In step S63, in the case that the time ratio Duty(i) is greater than the upper limit time ratio $Duty_{upp}$, the process proceeds to step S64, and in step S64, the control unit 80 sets the upper limit time ratio $Duty_{upp}$ as the current time ratio Duty. On the other hand, in the case that the time ratio Duty(i) is less than or equal to the upper limit time ratio $Duty_{upp}$, the process proceeds to step S65.

In step S65, the control unit 80 determines whether or not the calculated time ratio Duty(i) is less than a previously retained lower limit time ratio $Duty_{low}$. In addition, in the case that the time ratio Duty(i) is less than the lower limit time ratio $Duty_{low}$, the process proceeds to step S66, and in step S66, the control unit 80 sets the lower limit time ratio $Duty_{low}$ as the current time ratio Duty.

On the other hand, in the case that the time ratio Duty(i) is greater than or equal to the lower limit time ratio $Duty_{low}$, the process proceeds to step S67. In step S67, the control unit 80 sets the calculated time ratio Duty(i) as the current time ratio Duty.

After any one of steps S64, S66, and S67 has been executed, the control unit 80 brings the time ratio setting subroutine to an end, and returns to the main routine. In addition, in step S46, the control unit 80 performs a control to transfer the electrical charge of the battery cell 12(*i*) to the battery cell 12(*i*−1). At this time, from among the switching circuits 31 of the battery cell 12(*i*), concerning the switching circuit 31 that faces toward the battery cell 12(*i*−1), the control unit 80 repeatedly switches the switching circuit 31 on or off according to the time ratio Duty that was set in step S45. Consequently, the electrical charge corresponding to the time ratio Duty is transferred from the battery cell 12(*i*) toward the battery cell 12(*i*−1).

On the other hand, in the case of having proceeded from step S44 to step S47, the control unit 80 does not execute transferring of the electrical charge from the battery cell 12(*i*) to the battery cell 12(*i*−1). Therefore, the control unit 80 carries out step S47 without executing the time ratio setting subroutine. Step S47 is the same process flow as in step S10 of FIG. 9. After completion of step S46 or step S47, the control unit 80 returns to step S41, and thereafter, the same process flow is executed.

Further, in step S43, in the case that $V_{cell(i)} < V_{cell(i-1)}$, the control unit 80 proceeds to step S48, and in step S48, the same process flow as in step S11 of FIG. 9 is executed. In addition, in step S48, in the case that $\Delta V \geq V_{acc}$, and further, $V_{cell(i)}$ and $V_{cell(i-1)}$ lie within $V_{lim}$, the process proceeds to step S49. On the other hand, in the case that any one of $\Delta V < V_{acc}$, $V_{cell(i)}$ being outside of $V_{lim}$, and $V_{cell(i-1)}$ being outside of $V_{lim}$ is satisfied, the process proceeds to step S51.

In step S49, the control unit 80 executes the same time ratio setting subroutine (see FIG. 14) as in step S45. Consequently, the time ratio Duty for transferrin the electrical charge from the battery cell 12(*i*−1) to the battery cell 12(*i*) is set.

Thereafter, from among the switching circuits 31 of the battery cell 12(*i*−1), concerning the switching circuit 31 that faces toward the battery cell 12(*i*), the control unit 80 repeatedly switches the switching circuit 31 on or off according to the time ratio Duty that was set in step S49 (step S50). Consequently, the electrical charge corresponding to the time ratio Duty is transferred from the battery cell 12(*i*−1) toward the battery cell 12(*i*).

On the other hand, in the case of having proceeded from step S48 to step S51, the control unit 80 does not execute transferring of the electrical charge from the battery cell 12(*i*−1) to the battery cell 12(*i*). Therefore, the control unit 80 carries out step S51 without executing the time ratio setting subroutine. Step S51 is the same process flow as in step S13 of FIG. 9. After completion of step S50 or step S51, the control unit 80 returns to step S41, and thereafter, the same process flow is executed.

In accordance with the process flow discussed above, the electrical energy storage device 10A moves the electrical charge at the time ratio Duty in accordance with the potential difference DV between the adjacent battery cells 12. Therefore, for example, even in the case that the potential difference DV is large, the electrical energy storage device 10A can complete the transferring of the electrical charge between the battery cells 12 in a shorter time period, and is capable of suppressing power loss or the like.

Further, in the electrical energy storage device 10 and 10A, appropriate modifications may be also applied to the charge transfer structure 20 for transferring the electrical charge of each of the battery cells 12, in accordance with the essence and gist of the present invention. Hereinafter, other examples of the communication means between each of the battery cells 12 and the control unit 80 will be illustrated.

[First Modification]

Figure 15:
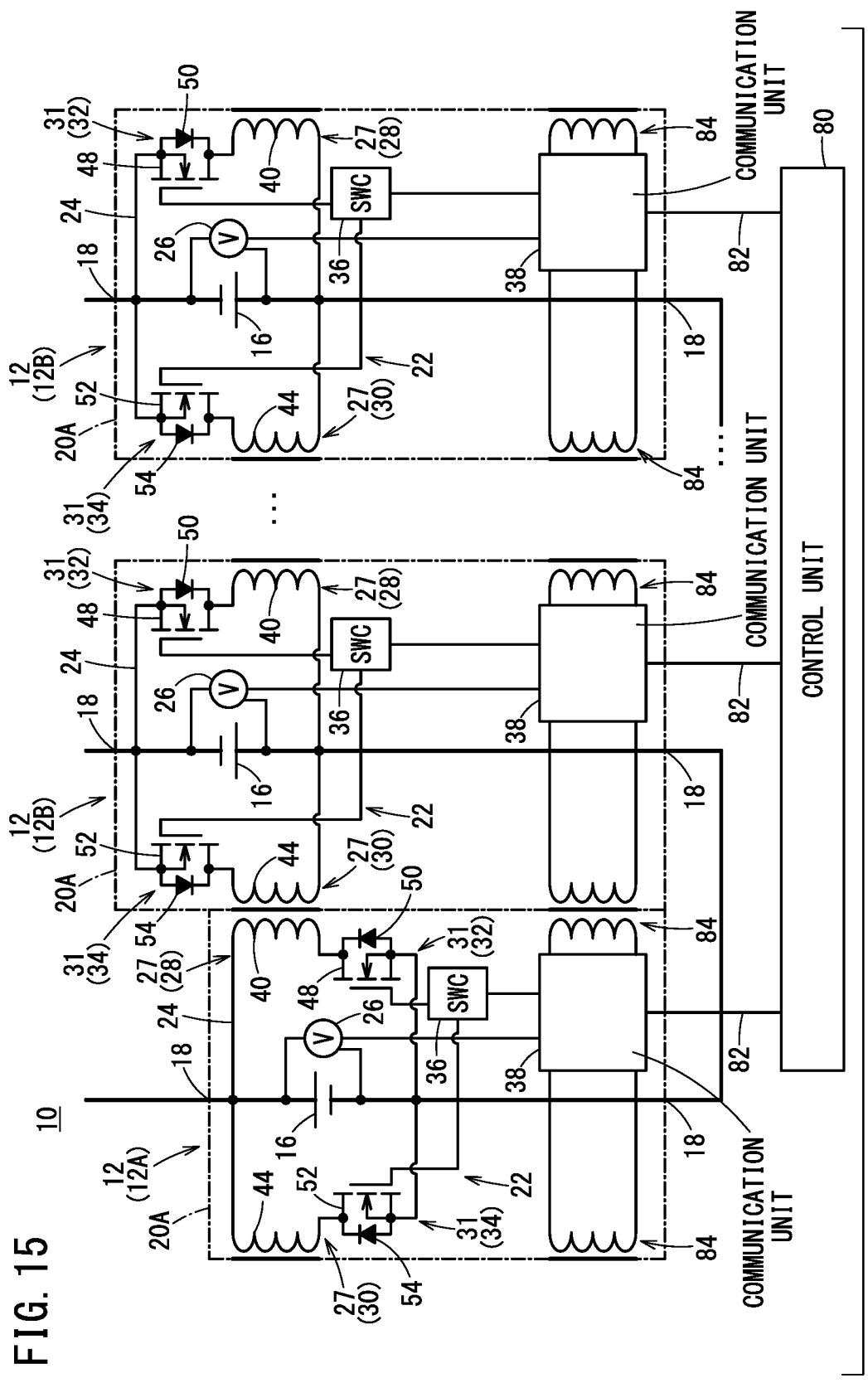
FIG. 15 is a circuit diagram showing charge transfer structures and a circuit between a plurality of battery cells according to a first modification.

The charge transfer structure 20A according to the first modification shown in FIG. 15 differs from the above-described charge transfer structure 20, in that a communication transformer 84 is formed between the communication units 38 of the adjacent battery cells 12. More specifically, the plurality of battery cells 12 having the charge transfer structure 20A constitute a daisy chain, and are configured in a manner so as to carry out communication amongst the adjacent battery cells 12, and with the control unit 80. Even if such a daisy chain is adopted in this manner, the electrical energy storage device 10, 10A is capable of transmitting and receiving necessary information between the adjacent battery cells 12 or to and from the control unit 80.

[Second Modification]

Figure 16:
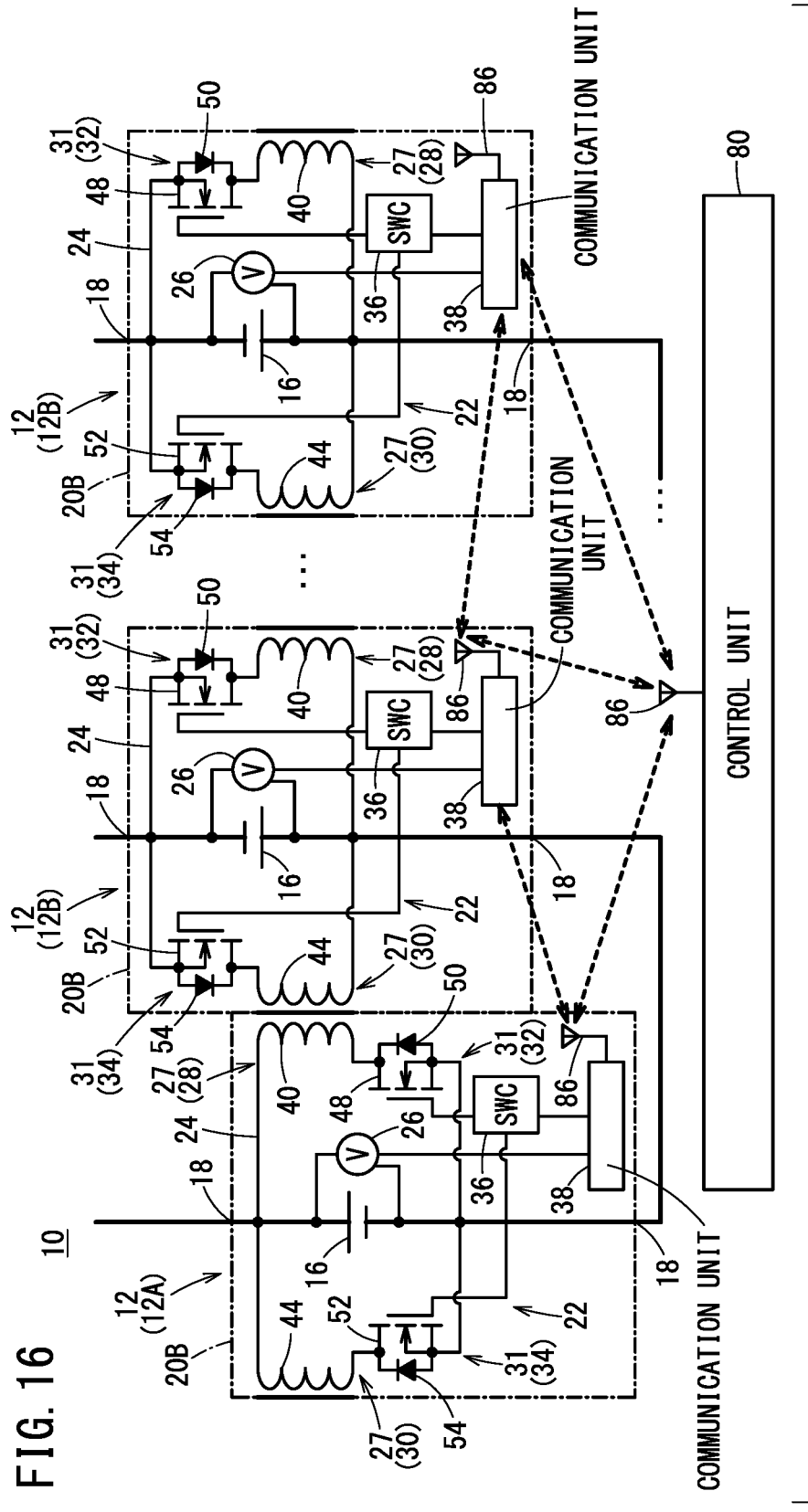
FIG. 16 is a circuit diagram showing charge transfer structures and a circuit between a plurality of battery cells according to a second modification.

The charge transfer structure 20B according to the second modification shown in FIG. 16 differs from the above-described charge transfer structures 20 and 20A, in that a wireless communication module 86 is applied to each of the battery cells 12 and the control unit 80, without providing the communication lines 82 between the communication units 38 and the control unit 80. More specifically, the plurality of battery cells 12 having the charge transfer structure 20B form a wireless communication system between the battery cells 12 and the control unit 80. Even if such a wireless communication system is configured in this manner, in the adjacent battery cells 12 or in the control unit 80, the electrical energy storage device 10, 10A is capable of transmitting and receiving necessary information. In particular, in the charge transfer structure 20B, if the wireless communication module 86 is mounted on the circuit board 56, the configuration of the battery cell 12 can be further simplified.

A description will be given below concerning technical concepts and effects that are capable of being grasped from the above-described embodiments.

One aspect of the present invention is characterized by the electrical energy storage device 10, 10A including the plurality of battery cells 12 connected together, each of the plurality of battery cells 12 including the transformer forming units 27 constituted by the inductors (the first inductor 40 and the second inductor 44) and the core members (the first core member 42 and the second core member 46), and configured to be capable of forming a transformer between the transformer forming unit itself and an inductor and a core member of an adjacent one of the battery cells 12, and a potential detection unit 26 that detects a potential of the battery cell 12, the electrical energy storage device further including the control unit 80 that controls the energized state of the inductor in each of the plurality of battery cells 12, wherein the control unit 80 compares the potentials of the adjacent battery cells 12 based on measurement results of the potential detection unit 26, and via the transformer in which the inductor of a battery cell 12 having a higher potential is made to serve as a primary side inductor and the inductor of a battery cell 12 having a lower potential is made to serve as a secondary side inductor, performs an equalization control to equalize the potentials of the plurality of battery cells 12, by supplying electrical charge from the battery cell 12 having the higher potential to the battery cell 12 having the lower potential.

In accordance with the above-described electrical energy storage device 10, 10A, in the equalization control, since the electrical charge (electrical energy) is transferred between the adjacent battery cells 12, by means of a simple configuration, it is possible to evenly distribute the potentials amongst the plurality of battery cells 12. Furthermore, since there is no need for each of the battery cells 12 to be equipped with a transformer made up from a primary inductor and a secondary inductor, in the electrical energy storage device 10, 10A, the charge transfer structures 20 for transferring electrical charge can be made smaller in scale, and even with such a configuration in which an equalization control is performed, a configuration which is superior in terms of layout can be obtained.

Further, each of the plurality of battery cells 12 includes the main body 16 that serves to charge and discharge the electrical charge, and each of the transformer forming units 27 is formed in a plate shape, and is arranged between adjacent ones of the main bodies 16. In accordance with such features, in the electrical energy storage device 10, 10A, the battery cells 12 can be easily stacked, and a more excellent layout property can be obtained.

Further, each of the plurality of battery cells 12 is provided with the transformer forming units 27 on the side surfaces (the first surface 16a and the second surface 16b) facing toward adjacent battery cells 12, and the inductors (the first inductor 40 and the second inductor 44) are configured to be wound along a planar direction of the side surfaces. In accordance with such features, even in a structure in which the electrical energy storage device 10, 10A uses the transformers to transfer electrical charge, the transformers can be easily formed between the adjacent battery cells 12.

Further, the core members (the first core member 42 and the second core member 46) extend along the side surfaces (the first surface 16a and the second surface 16b), and are formed in a sheet shape capable of accommodating the inductors (the first inductor 40 and the second inductor 44) on inner sides thereof, and further, each of the core members include a central portion (the central protrusion 42b) that is in contact with the core member of the adjacent battery cell 12, at the center of the inductor, and an outer side portion (the outer side protrusion 42c) that is in contact with the core member of the adjacent battery cell 12, on an outer side of the inductor. In this manner, due to the sheet-shaped core members, the electrical energy storage device 10, 10A is capable of easily forming the transformers between the adjacent battery cells 12, and increase of the thickness in the stacking direction can be suppressed.

Further, each of the plurality of battery cells 12 includes the support member (the charge transfer structure 20) that supports the transformer forming units 27 and the potential detection unit 26, and having conductive paths (the copper foils 60) for the transformer forming units 27 and the potential detection unit 26. In this manner, since the transformer forming units 27 and the potential detection unit 26 are collectively supported by the support member having the conductive paths, in the electrical energy storage device 10, 10A, the transformer forming units 27 and the potential detection unit 26 can be easily provided in each of the battery cells 12, and furthermore, at the time of installation, operational efficiency can be improved by reducing the number of parts or the like.

Further, the support member (the charge transfer structure 20) includes the first site 20a disposed on one side surface (the first surface 16a) of the battery cell 12, the second site 20b disposed on a side surface (the second surface 16b) on an opposite side from the one side surface of the battery cell 12, and the third site 20c disposed on an upper surface 16c of the battery cell 12 and that connects the first site 20a and the second site 20b, each of the transformer forming units 27 is disposed on the first site 20a or the second site 20b, and the potential detection unit 26 is disposed on the third site 20c. In accordance with such features, in the electrical energy storage device 10, 10A, simply by placing the support member from above the main body 16 so as to cover the main body 16, the first site 20a, the second site 20b, and the third site 20c can be easily arranged at appropriate positions of the battery cell 12.

Further, there are provided the switching circuits 31 that turn on and turn off the flow of electric current with respect to the inductors (the first inductor 40 and the second inductor 44), wherein, when performing the equalization control, the control unit 80 maintains a time ratio Duty, which is a ratio of an on-time period during which electric current is supplied to the inductor by the switching circuit 31, constant. In accordance with these features, in the equalization control, the electrical energy storage device 10 is capable of preventing the potentials of the respective battery cells 12 from overshooting or undershooting.

Further, there are provided the switching circuits 31 that turn on and turn off the flow of electric current with respect to the inductors (the first inductor 40 and the second inductor 44), wherein when performing the equalization control, the control unit 80 increases the time ratio Duty, which is a ratio of an on-time period during which electric current is supplied to the inductor by the switching circuit 31, as a potential difference DV between the adjacent battery cells 12 grows larger. In this manner, by increasing the time ratio Duty as the potential difference DV grows larger, the electrical energy storage device 10A can hasten the equalization of the potentials between the battery cells 12.

Further, the control unit 80 calculates the potential difference DV of the plurality of battery cells 12 based on the measurement results of the potential detection unit 26, and compares the previously retained allowable potential range $V_{acc}$ with the calculated potential difference DV. Further, the control unit performs the equalization control in the case that the calculated potential difference DV is greater than the allowable potential range $V_{acc}$, and while on the other hand, does not perform the equalization control in the case that the calculated potential difference DV is less than or equal to the allowable potential range $V_{acc}$. In accordance with such features, the electrical energy storage device 10, 10A can terminate the equalization control when the potential difference DV amongst the battery cells 12 becomes less than or equal to the allowable potential range $V_{acc}$, thereby shortening the execution time of the equalization control, and suppressing power loss.

The control unit 80 stores in advance a limited range $V_{lim}$ of potentials within which the battery cells 12 do not become in a state of excessive voltage or excessive discharging. Further, the control unit performs the equalization control amongst the battery cells 12 having potentials within the limited range $V_{lim}$, and while on the other hand, in the case that a battery cell 12 is recognized having a potential outside of the limited range $V_{lim}$, the control unit does not perform the equalization control on that battery cell 12. In accordance with such features, the electrical energy storage device 10, 10A can satisfactorily perform the equalization control, while suppressing the battery cells 12 from being placed in a state of excessive voltage or excessive discharging.

Each of the plurality of battery cells 12 includes a communication unit 38 (the wireless communication module 86) that carries out wireless communication with the control unit 80. In accordance with this feature, the electrical energy storage device 10, 10A is capable of reducing the number of communication lines 82, and can simplify the communication system between the battery cells 12 and the control unit 80.

The present invention is not particularly limited to the embodiment described above, and various modifications are possible without departing from the essence and gist of the present invention.

What is claimed is:

1. An electrical energy storage device comprising a plurality of battery cells connected together;
   each of the plurality of battery cells comprising:
   a transformer forming unit including an inductor and a core member, and configured to form a transformer between the transformer forming unit itself and an inductor and a core member of an adjacent battery cell; and
   a potential detection unit configured to detect a potential of the battery cell;
   the electrical energy storage device further comprising a control unit configured to control an energized state of the inductor in each of the plurality of battery cells;
   wherein the control unit compares the potentials of the adjacent battery cells based on measurement results of the potential detection unit, and via the transformer in which the inductor of a battery cell having a higher potential is made to serve as a primary side inductor and the inductor of another battery cell having a lower potential is made to serve as a secondary side inductor, performs an equalization control to equalize the potentials of the plurality of battery cells, by supplying electrical charge from the battery cell having the higher potential to the battery cell having the lower potential;
   each of the plurality of battery cells comprises a main body configured to charge and discharge the electrical charge;
   the transformer forming unit is formed in a plate shape, and is arranged between adjacent ones of the main bodies;
   in the inductor, windings are configured along a planar direction of a side surface of the main body;
   the core member extends along the side surface, and is formed in a sheet shape so as to accommodate the inductor on an inner side thereof; and
   the core member includes a central portion that is in contact with another core member of the adjacent battery cell, at a center of the inductor, and an outer side portion that is in contact with the other core member of the adjacent battery cell, on an outer side of the inductor.

2. The electrical energy storage device according to claim 1, wherein each of the plurality of battery cells comprises a support member configured to support the transformer forming unit and the potential detection unit, and having conductive paths for the transformer forming unit and the potential detection unit.

3. An electrical energy storage device comprising a plurality of battery cells connected together;
   each of the plurality of battery cells comprising:
   a transformer forming unit including an inductor and a core member, and configured to form a transformer between the transformer forming unit itself and an inductor and a core member of an adjacent battery cell; and
   a potential detection unit configured to detect a potential of the battery cell;
   the electrical energy storage device further comprising a control unit configured to control an energized state of the inductor in each of the plurality of battery cells;
   wherein the control unit compares the potentials of the adjacent battery cells based on measurement results of the potential detection unit, and via the transformer in which the inductor of a battery cell having a higher potential is made to serve as a primary side inductor and the inductor of another battery cell having a lower potential is made to serve as a secondary side inductor, performs an equalization control to equalize the potentials of the plurality of battery cells, by supplying electrical charge from the battery cell having the higher potential to the battery cell having the lower potential;
   each of the plurality of battery cells comprises a support member configured to support the transformer forming unit and the potential detection unit, and having conductive paths for the transformer forming unit and the potential detection unit;
   the support member includes a first site disposed on one side surface of the battery cell, a second site disposed on a side surface on an opposite side from the one side surface of the battery cell, and a third site disposed on an upper surface of the battery cell and configured to connect the first site and the second site;
   the transformer forming unit is disposed on the first site or the second site; and
   the potential detection unit is disposed on the third site.

4. The electrical energy storage device according to claim 1, further comprising:
   a switching circuit configured to turn on and turn off flow of electric current with respect to the inductor;
   wherein, when performing the equalization control, the control unit maintains a time ratio, which is a ratio of an on-time period during which electric current is supplied to the inductor by the switching circuit, constant.

5. The electrical energy storage device according to claim 1, further comprising:
   a switching circuit configured to turn on and turn off flow of electric current with respect to the inductor;

wherein, when performing the equalization control, the control unit increases a time ratio, which is a ratio of an on-time period during which electric current is supplied to the inductor by the switching circuit, as a potential difference between the adjacent battery cells grows larger.

6. The electrical energy storage device according to claim 1, wherein:

the control unit calculates a potential difference of the plurality of battery cells based on measurement results of the potential detection unit, and compares a previously retained allowable potential range with the calculated potential difference; and the control unit performs the equalization control in a case that the calculated potential difference is greater than the allowable potential range; and while on the other hand, does not perform the equalization control in a case that the calculated potential difference is less than or equal to the allowable potential range.

7. The electrical energy storage device according to claim 1, wherein the control unit stores in advance a limited range of potentials within which the battery cells do not become in a state of excessive voltage or excessive discharging; and the control unit performs the equalization control amongst battery cells having potentials within the limited range, and while on the other hand, in a case that a battery cell is recognized having a potential outside of the limited range, the control unit does not perform the equalization control on that battery cell.

8. The electrical energy storage device according to claim 1, wherein each of the plurality of battery cells comprises a communication unit configured to carry out wireless communication with the control unit.

* * * * *